United States Patent
Guo et al.

(10) Patent No.: US 8,152,975 B2
(45) Date of Patent: *Apr. 10, 2012

(54) DEPOSITION SYSTEM WITH IMPROVED MATERIAL UTILIZATION

(75) Inventors: George X. Guo, Palo Alto, CA (US); Kai-an Wang, Cupertino, CA (US)

(73) Assignee: Ascentool International, Milpitas, CA (US)

(*) Notice: Subject to any disclaimer, the term of this patent is extended or adjusted under 35 U.S.C. 154(b) by 1144 days.

This patent is subject to a terminal disclaimer.

(21) Appl. No.: 11/694,843

(22) Filed: Mar. 30, 2007

(65) Prior Publication Data

US 2008/0241409 A1    Oct. 2, 2008

(51) Int. Cl.
*C23C 14/34* (2006.01)

(52) U.S. Cl. ......... 204/298.12; 204/298.19; 204/298.26; 204/298.21

(58) Field of Classification Search ............. 204/298.19, 204/298.12, 298.26, 298.21
See application file for complete search history.

(56) References Cited

U.S. PATENT DOCUMENTS

| | | | | |
|---|---|---|---|---|
| 4,200,510 A * | 4/1980 | O'Connell et al. | ...... | 204/192.12 |
| 4,443,318 A * | 4/1984 | McKelvey | ...... | 204/298.23 |
| 4,465,575 A * | 8/1984 | Love et al. | ...... | 204/192.26 |
| 5,317,006 A * | 5/1994 | Kumar | ...... | 204/298.12 |
| 5,333,726 A | 8/1994 | Makowiecki | | |
| 5,374,343 A | 12/1994 | Sasaki | | |
| 5,747,119 A | 5/1998 | Hirata | | |
| 5,755,938 A | 5/1998 | Fukui | | |
| 5,953,827 A | 9/1999 | Or | | |
| 5,985,115 A | 11/1999 | Hartsough | | |
| 6,080,287 A | 6/2000 | Drewery | | |
| 6,113,752 A * | 9/2000 | Hollstein | ...... | 204/192.12 |
| 6,207,026 B1 | 3/2001 | Crocker | | |
| 6,217,714 B1 * | 4/2001 | Nishihara et al. | ...... | 204/192.12 |
| 6,221,217 B1 | 4/2001 | Moslehi | | |
| 6,235,634 B1 | 5/2001 | White | | |
| 6,238,532 B1 | 5/2001 | Rossnagel | | |
| 6,413,380 B1 | 7/2002 | Pinarbasi | | |
| 6,454,920 B1 * | 9/2002 | Haag et al. | ...... | 204/298.12 |
| 6,641,701 B1 | 11/2003 | Tepman | | |
| 6,692,618 B2 | 2/2004 | Dubs | | |
| 6,730,194 B2 | 5/2004 | Schertler | | |
| 6,740,585 B2 | 5/2004 | Yoon | | |
| 6,758,948 B2 | 7/2004 | Johnson | | |
| 7,638,022 B2 * | 12/2009 | Guo | ...... | 204/298.16 |

* cited by examiner

*Primary Examiner* — Keith Hendricks
*Assistant Examiner* — Jason M Berman
(74) *Attorney, Agent, or Firm* — SV Patent Service

(57) ABSTRACT

A target assembly for material deposition includes a first target piece having a first sputtering surface and comprising a first target material that is to be sputtered off the first sputtering surface and to deposit on a substrate. The target assembly also includes a second target piece juxtaposed to the first target piece. The second target piece comprises a second sputtering surface and a second target material that can be sputtered off the second sputtering surface and to deposit on the substrate. The first target piece and the second target piece are configured to be switched in positions and/or orientations after a period of sputtering operations.

33 Claims, 24 Drawing Sheets

DEPOSITION SYSTEM WITH IMPROVED MATERIAL UTILIZATION

TECHNICAL FIELD

This application relates to an apparatus for depositing material on a substrate.

BACKGROUND

Material deposition is widely used in window glass coating, flat panel display manufacturing, coating on flexible films (such as webs), hard disk coating, industrial surface coating, semiconductor wafer processing, photovoltaic panels, and other applications. Materials are sputtered or vaporized from a target source and deposited on a substrate. Conventional deposition systems have various drawbacks in material utilization. For example, referring to FIGS. 1A-1E, a deposition system 100 includes a rectangular target 110 over a large substrate 115 in a vacuum chamber 120. A magnetron 130 is held stationary behind the target 110. The substrate 115 can be transported in a direction 150 relative to the target 110 and the magnetron 130 such that the substrate 115 can receive a uniform deposition across its top surface. The deposition system 100 can also include a power supply 140 that can produce an electric bias between the target and walls of the vacuum chamber 120.

The magnetron 130 includes a magnetic pole 132 of a first polarity and a magnetic pole 135 of a second polarity opposite to the first polarity. The magnetron 130 can produce magnetic flux outside of the sputtering surface 112 on the lower side of the target 110 (as shown in FIG. 1B) to confine electrons near the sputtering surface 112. More electrons can be confined near the magnetic field parallel to the sputtering surface 112 wherein the magnetic field strength is at local maximum. A close loop can be formed by the locations having local maximum magnetic field strength. The close path can guide the migration path for the trapped electrons near the sputtering surface 112. The closed-loop magnetic field can enhance the ionization efficiency of the sputtering gas (i.e. the plasma) to produce more effectively confine electrons near the sputtering surface 112. The enhanced ionization can also lower the operating pressure during sputter deposition.

A drawback of the deposition system 100 is the uneven erosion in the target 110 after repeated sputtering operations. As shown in FIGS. 1D and 1E, a non-uniform erosion pattern 115 usually appears over the sputtering surface 112 of the target 110 after a period of sputtering operations. The erosion pattern 115 can include a close-looped groove that matches the magnetic field strength. The target locations 116 experiencing the most erosion correspond to locations having high magnetic field strength where the sputtering gas is the most enhanced. The target 110 has to be replaced once the target locations 116 reach near to the top surface of the target 110. The unused target material 117 is discarded. The non-uniform erosion therefore causes low target utilization in the target 110 in the deposition system 100.

There is therefore a need to maximize the utilization of target materials and to minimize waste in material depositions.

SUMMARY

In one aspect, the present invention relates to a target assembly for material deposition. The target assembly includes a first target piece having a first sputtering surface and comprising a first target material that is to be sputtered off the first sputtering surface and to deposit on a substrate. The target assembly also includes a second target piece juxtaposed to the first target piece. The second target piece comprises a second sputtering surface and a second target material that can be sputtered off the second sputtering surface and to deposit on the substrate. The first target piece and the second target piece are configured to be switched in positions, or orientation, or a combination thereof after a period of sputtering operations.

In another aspect, the present invention relates to a magnetron/target assembly for material deposition. The magnetron/target assembly includes a first target piece including a first sputtering surface and a first target material that is configured to be sputtered off the first sputtering surface and to deposit on a substrate, and a second target piece juxtaposed to the first target piece. The second target piece includes a second sputtering surface and a second target material configured to be sputtered off the second sputtering surface and to deposit on the substrate. The first target piece and the second target piece are configured to be switched in positions, or orientation, or a combination thereof after a period of sputtering operations. The magnetron/target assembly also includes a magnetron configured to produce a magnetic field near the first sputtering surface and the second sputtering surface to deposit the first target material and the second target material to the substrate.

In another aspect, the present invention relates to a deposition system including a plurality of substrates; and a plurality of target assemblies are sequentially positioned in a first close loop. At least one of the target assemblies includes a first target piece including a first sputtering surface and a first target material configured to be sputtered off the first sputtering surface and to deposit on one of the substrates, and a second target piece juxtaposed to the first target piece. The second target piece includes a second sputtering surface and a second target material configured to be sputtered off the second sputtering surface and to deposit on the one of the substrates. The first target piece and the second target piece are configured to be switched in positions, or orientation, or a combination thereof after a period of sputtering operations.

In another aspect, the present invention relates to a method for material deposition. The method includes simultaneously sputtering a first target material from a first sputtering surface on a first target piece and a second target material from a second sputtering surface on a second target piece juxtaposed to the first target piece; depositing the first target material sputtered off the first sputtering surface and the second target material sputtered off the second sputtering surface on a substrate; after the step of depositing, switching positions, or orientation, or a combination thereof of the first target piece and the second target piece; and after the step of switching positions, simultaneously sputtering the first target material from the first sputtering surface and the second target material from the second sputtering surface.

The method includes implementations of the system may include one or more of the following. The target assembly can further include a backing plate configured to support the first target piece and the second target piece, wherein the first target piece and the second target piece are configured to be attached to the backing plate and detached from the backing plate for switching the positions, or orientation, or a combination thereof of the first target piece and the second target piece. The first target piece and the second target piece can include substantially the same target material. The first target piece and the second target piece can include different target materials. The first target piece and the second target piece can have substantially the same shape and dimensions. The first sputtering surface and the second sputtering surface can be substantially co-planar. The first target piece and the second target piece can be rectangles with a long side of the first target piece positioned by a long side of the second target piece.

The target assembly can further include an end target piece positioned along a short side of the first target piece and a short side of the second target piece. The target assembly can further include a third target piece having a third sputtering surface, wherein the third target piece comprises a third target material that is configured to be sputtered off the third sputtering surface and to deposit on the substrate; and a fourth target piece comprising a fourth sputtering surface and a fourth target material that is configured to be sputtered off the fourth sputtering surface and to deposit on the substrate, wherein the third target piece and the fourth target piece are configured to be switched in positions, or orientation, or a combination thereof after a period of sputtering operations.

Embodiments may include one or more of the following advantages. The disclosed systems and methods can improve material usage efficiency in a deposition system. The disclosed target arrangements and methods can improve target utilization and reduce target cost by more fully utilizing the materials on a target. Furthermore, the disclosed target arrangements and methods are flexible; they can be applied to deposition systems having different target and magnetron configurations.

The details of one or more embodiments are set forth in the accompanying drawings and in the description below. Other features, objects, and advantages of the invention will become apparent from the description and drawings, and from the claims.

DETAILED DESCRIPTION

Figure 2A:
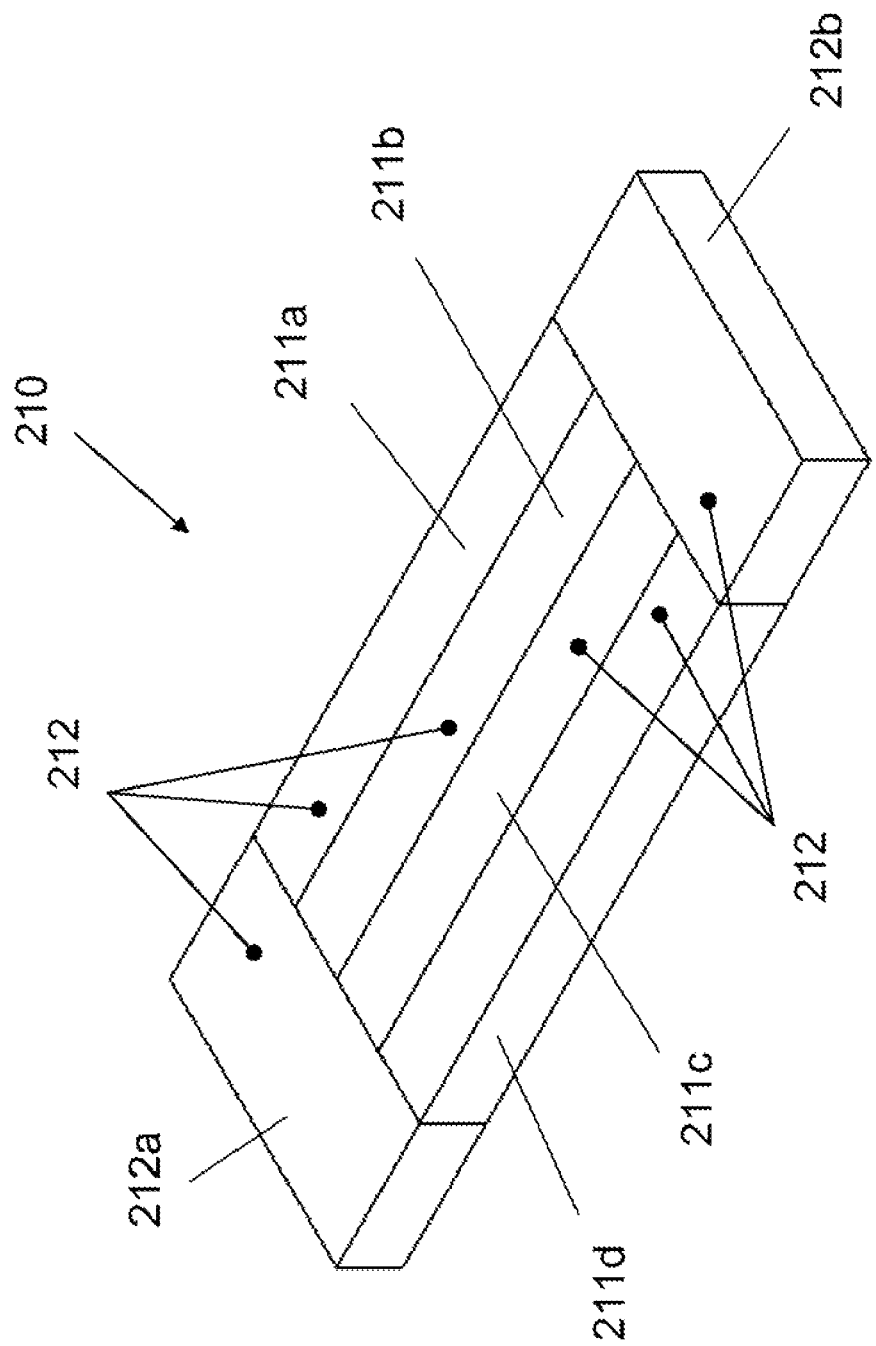
FIG. 2A is a perspective view of a target assembly showing in accordance with the present specification.

FIG. 2A depicts a target assembly 210 that is compatible with various types of deposition systems such as the deposition system 100. The target assembly 210 can be disposed next to a magnetron. The target assembly 210 can include end target pieces 212a and 212b, and a plurality of linear target pieces 211a-211d in between the end target pieces 212a and 212b. The linear target pieces 211a and 211d, 211b and 211c can have substantially the same shape and substantially the same dimensions. In some cases, the linear target pieces 211a-211d can have substantially the same shape and substantially the same dimensions. The linear target pieces 211a-211d can be rectangles with their long edges positioned next to each other. The end target pieces 212a and 212b and the linear pieces 211a-211d can each include a sputtering surface 212. The sputtering surfaces 212 are to be positioned in a vacuum environment during sputtering operations.

Figure 1A:
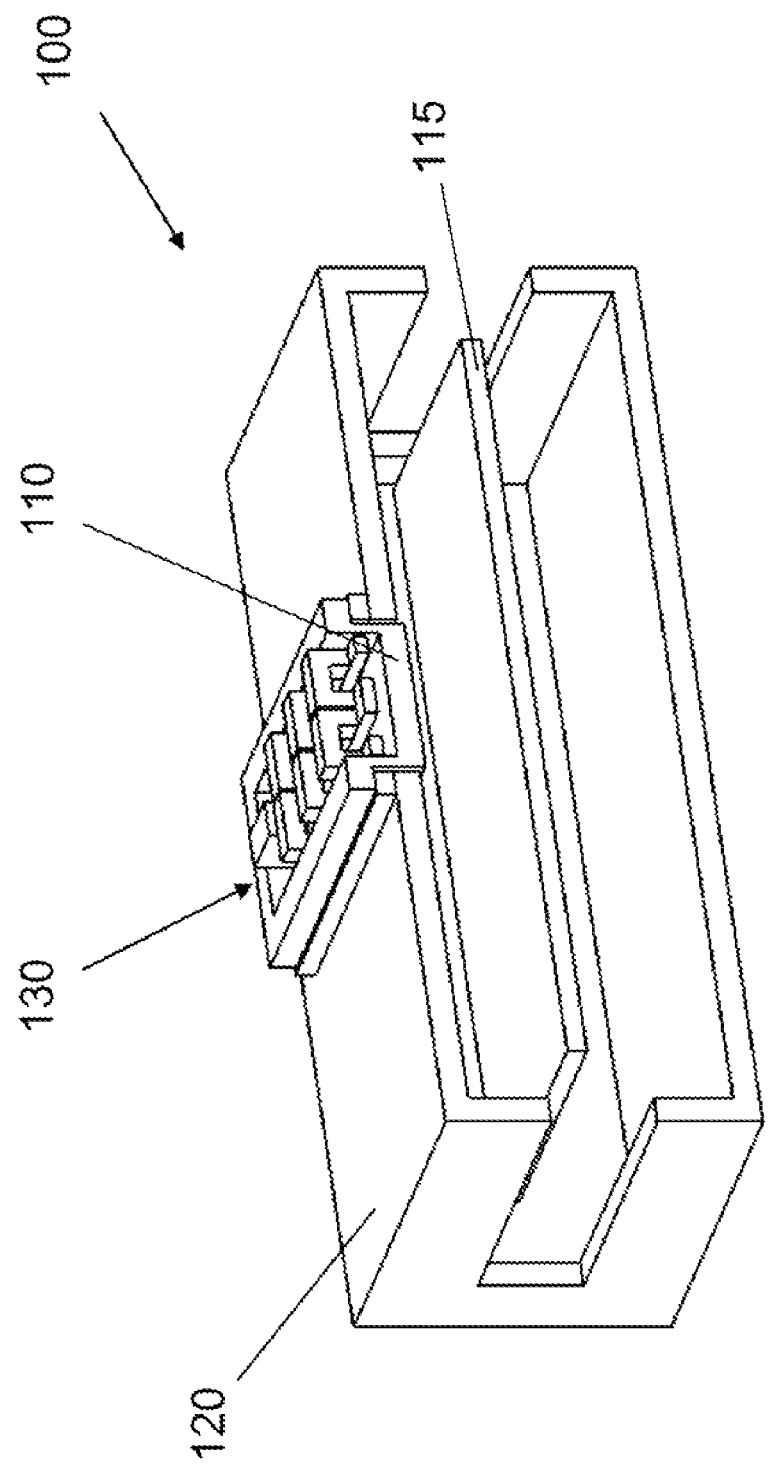
FIG. 1A illustrates a cross section of a conventional deposition system.
Figure 1B:
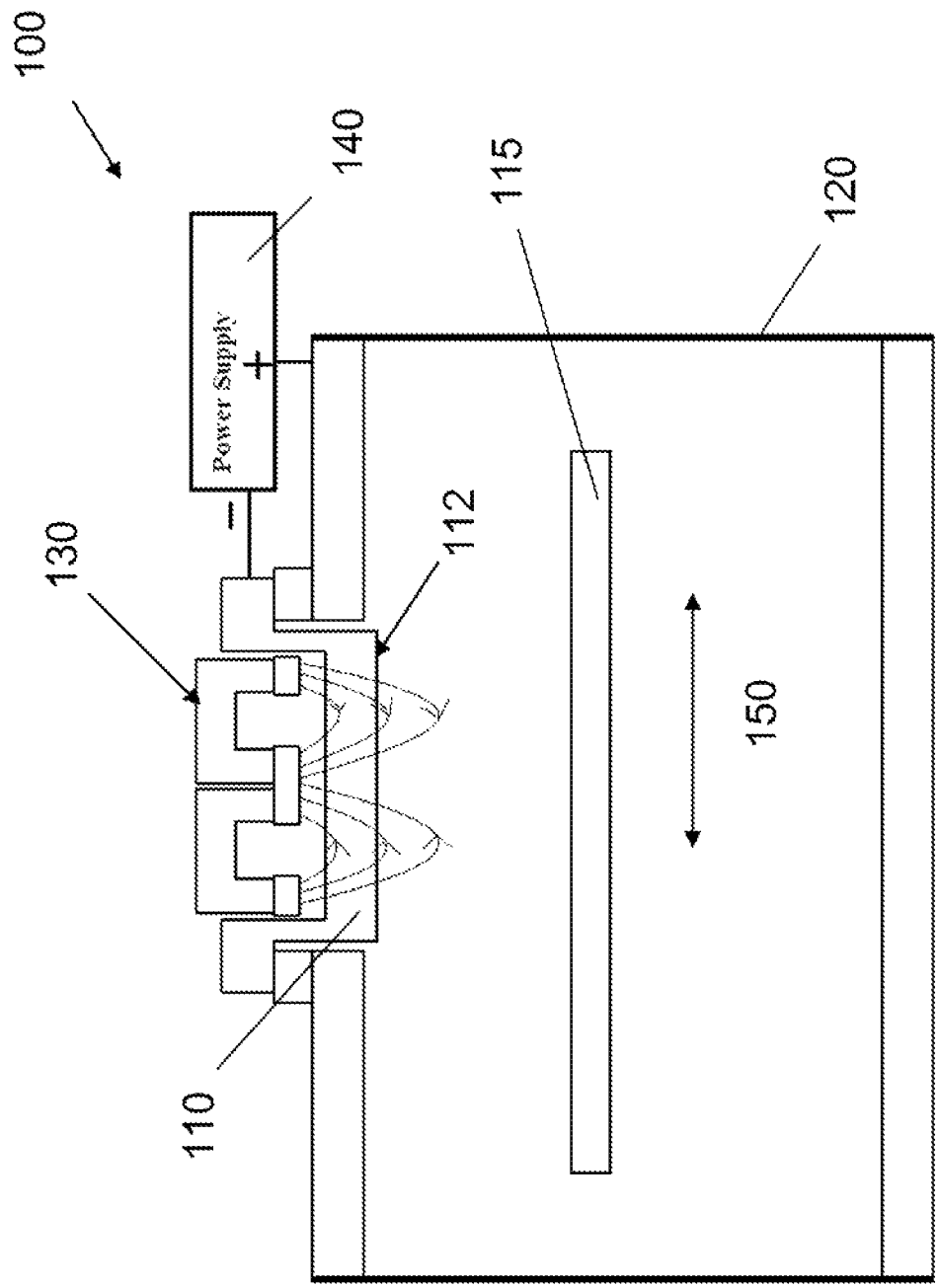
FIG. 1B is a cross-sectional view of the conventional deposition system of FIG. 1A.
Figure 1C:
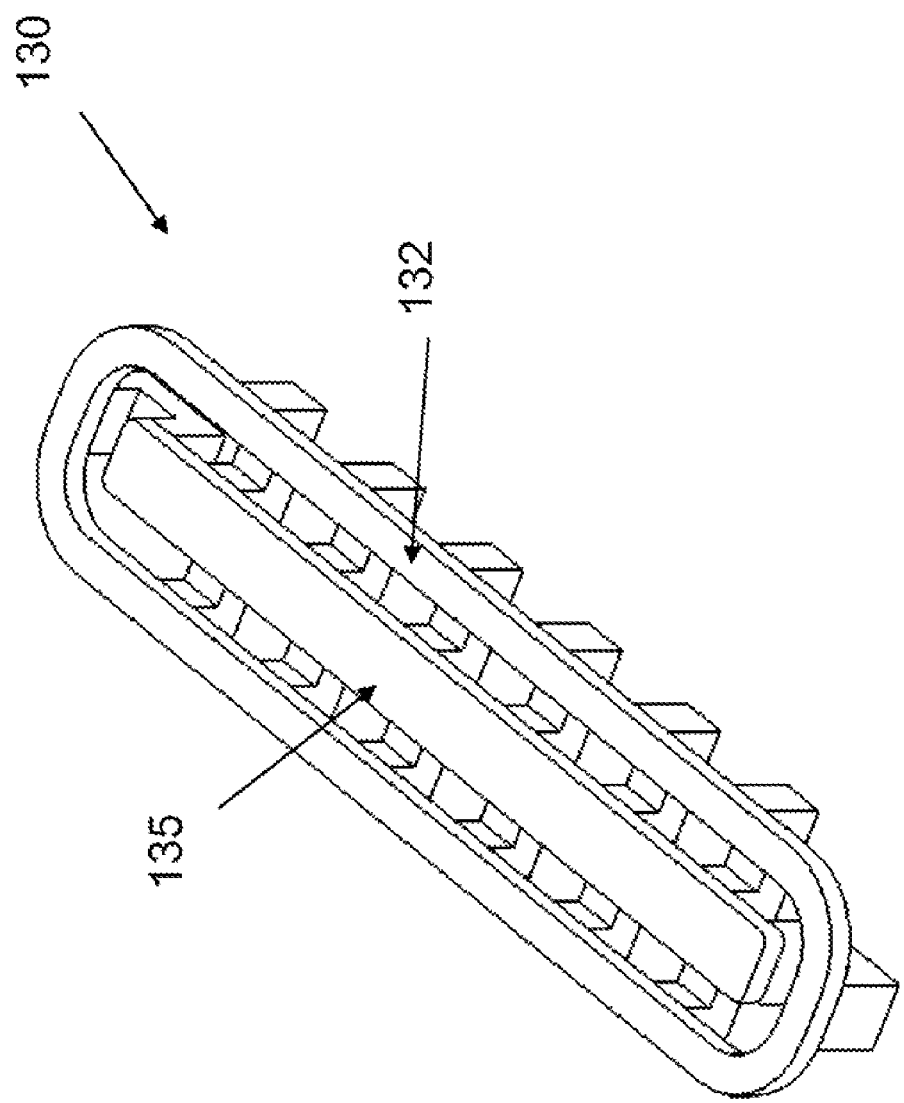
FIG. 1C is a bottom perspective view of the magnetron in the conventional deposition system of FIG. 1A.
Figure 1D:
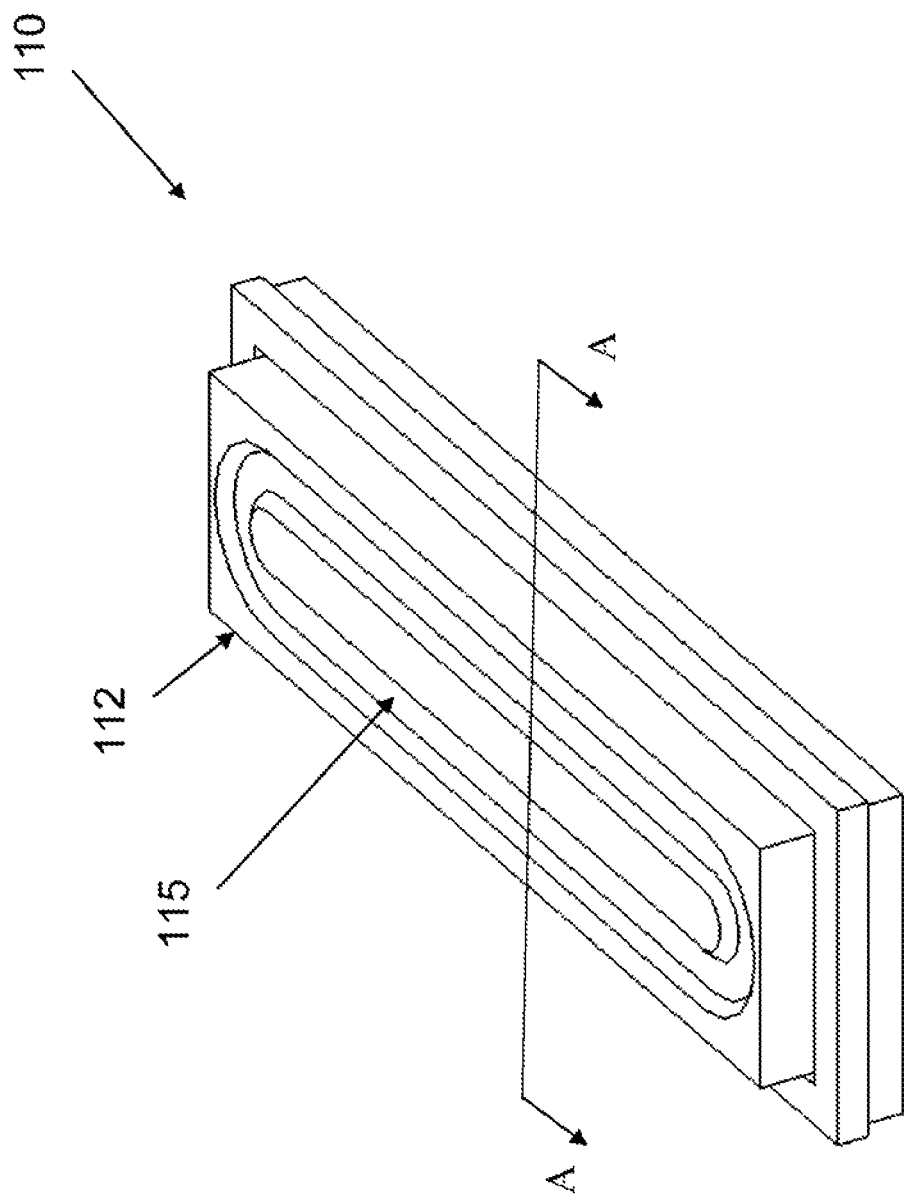
FIG. 1D is a bottom perspective view of an erosion pattern on the target in the conventional deposition system of FIG. 1A.
Figure 2B:
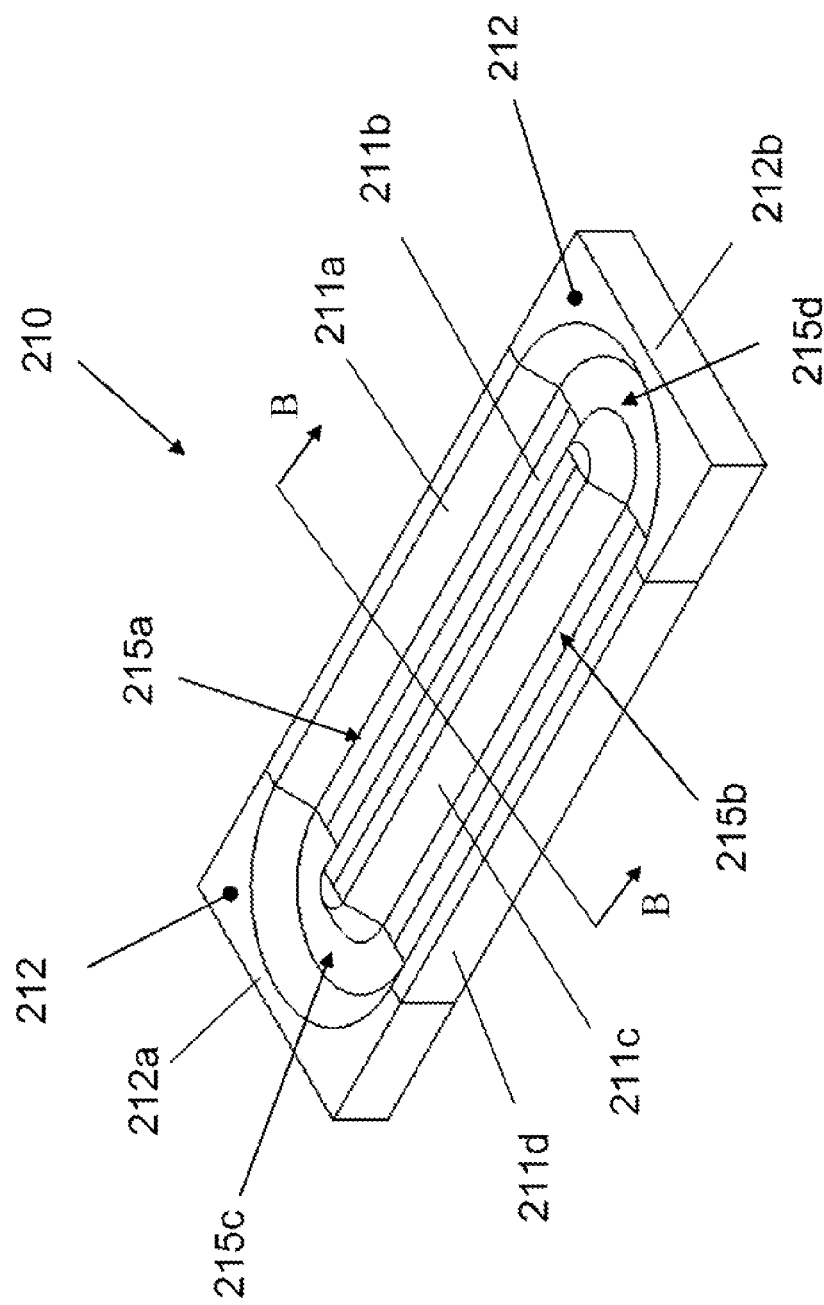
FIG. 2B is a perspective view of the target assembly of FIG. 2A after a period of sputtering operations.
Figure 2C:
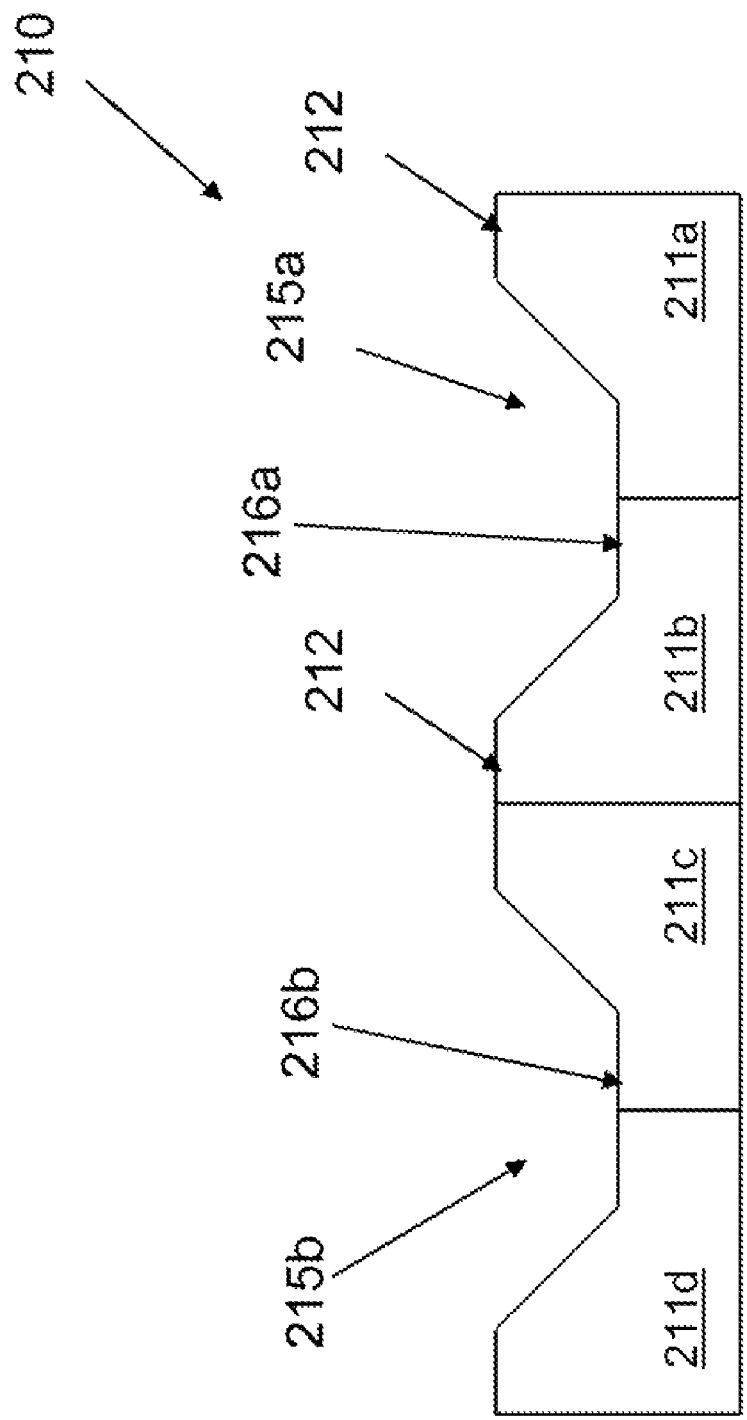
FIG. 2C is a cross-sectional view of the erosion pattern on the target assembly along line B-B FIG. 2B.

After an extended period of sputtering operations, erosion grooves 215a-215d, as shown in FIGS. 2B and 2C, can appear on the sputtering surfaces 212 of the end target pieces 212a and 212b and the linear target pieces 211a-211d. The groove 215a is in the linear target pieces 211a, 211b. The groove 215b is in the linear target pieces 211c, 211d. The groove 215c and 215d are respectively in the end target pieces 212a, 212b. As described above, the patterns of the erosions groove 215a, 215b, 215c, 215d are determined by the magnetic field produced by the magnetron (e.g. the magnetron 130 in the deposition system 100) adjacent the target assembly 210. The bottoms 216a, 216b in the groove 215a and 215b are located at where the magnetron produces the strongest magnetic field. The magnets 132, 135 in the magnetron 130 can be symmetrically configured in the lateral direction, as shown in FIG. 1C such that the erosion pattern in the linear target pieces 211a can be substantially symmetric to the erosion pattern in the linear target pieces 211d. The erosion pattern in the linear target pieces 211c can be substantially symmetric to the erosion pattern in the linear target pieces 211b. Optionally, the groove 215a and the groove 215b can have substantially the same shape, as shown in FIG. 2C.

Figure 2D:
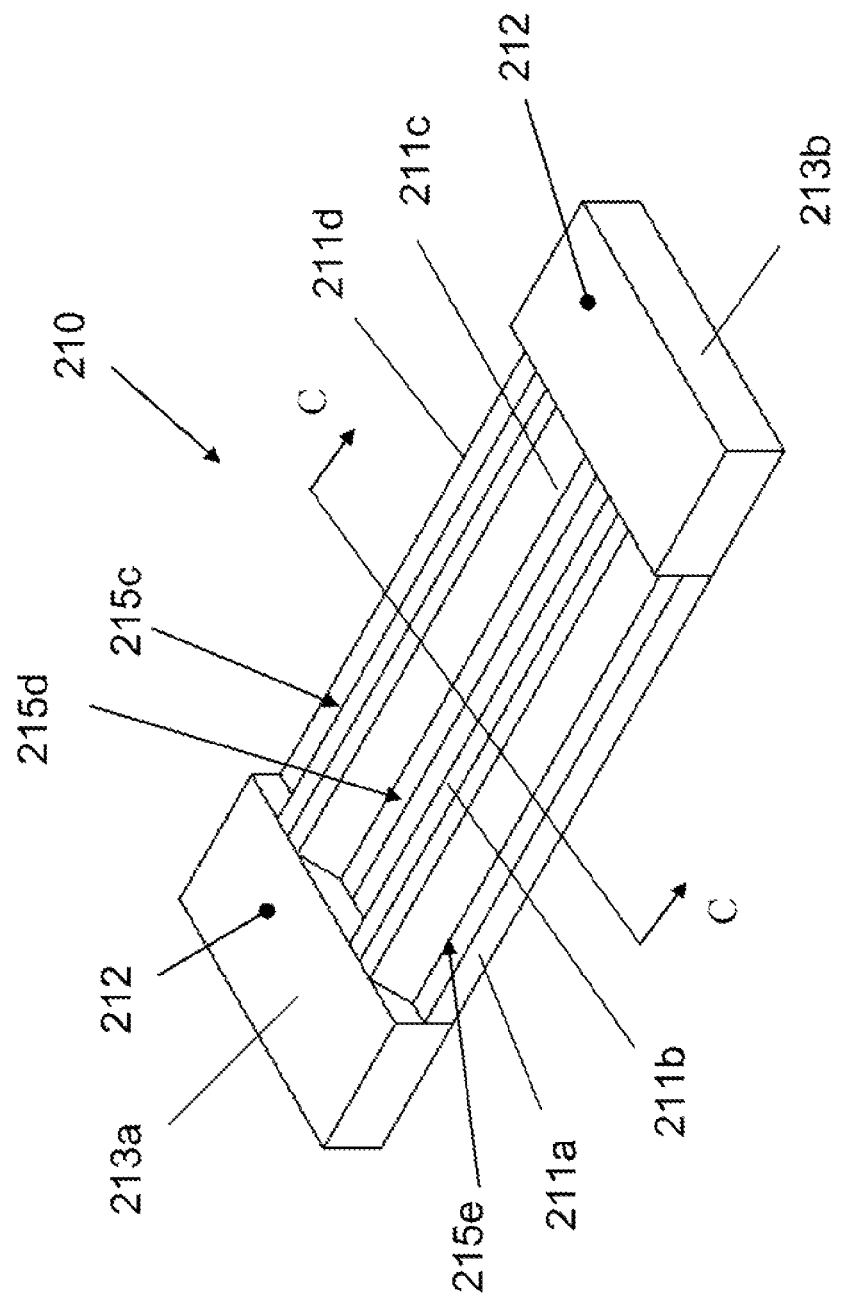
FIG. 2D is a perspective view of a target assembly after reconfiguration and replacement of the target assemble in FIG. 2B.
Figure 2E:
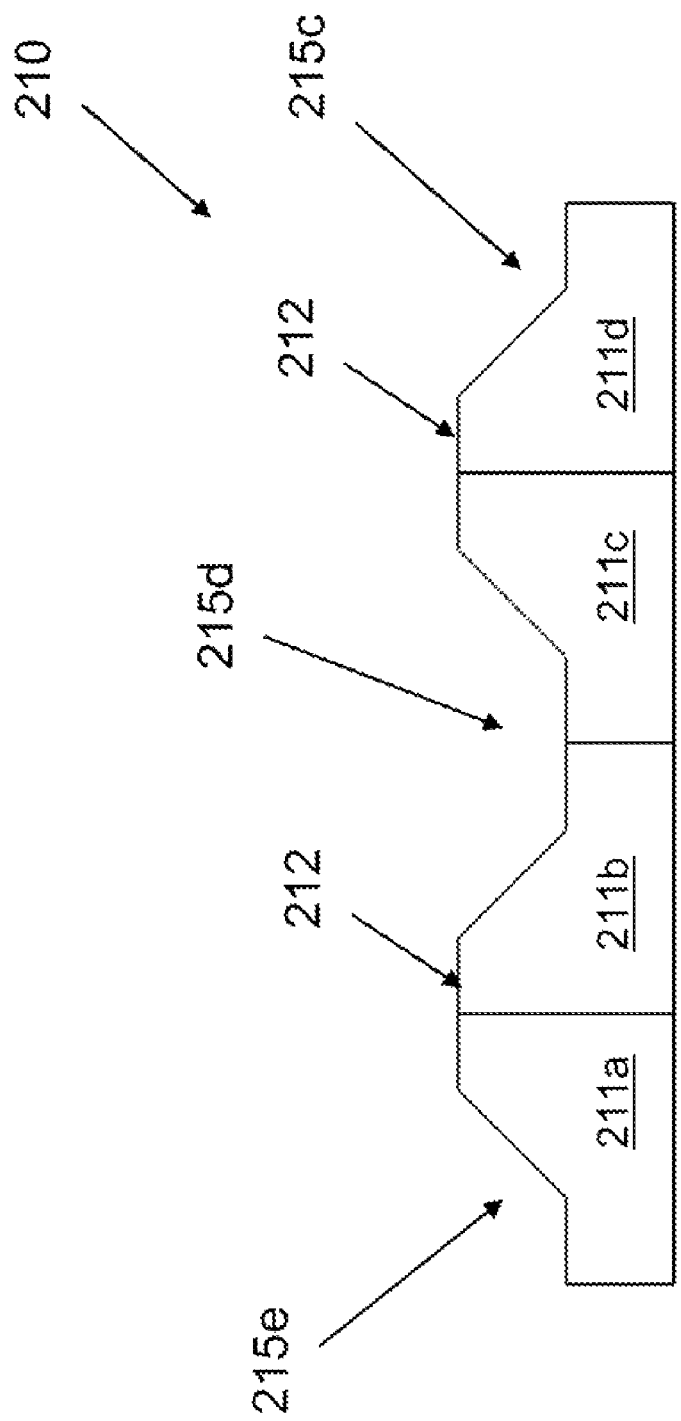
FIG. 2E is a cross-sectional view of the target assembly along line C-C FIG. 2D.

Optionally, the target assembly 210 can be mounted on a backing plate (that is to be positioned between the target assembly and the magnetron by bonding to or screwing onto the backing plate. The linear pieces 211a-211d can be detached from the backing plate and switched in positions, or orientation, or a combination of positions and orientations. Alternatively, the linear pieces 211a-211d can be mounted on separate backing plates and switch in position together with each associated backing plate. As shown in FIGS. 2D and 2E, the linear pieces 211a and 211d can be switched in positions. The linear pieces 211c and 211b can be switched in positions. The grooves 215a and 215b are also reconfigured to form grooves 215c-215e on the reconfigured linear pieces 211a-211d. Alternatively, each of the linear pieces 211a-211d can be turned 180 degrees and mounted in the same location and forms structure shown in FIGS. 2D and 2E.

Figure 2F:
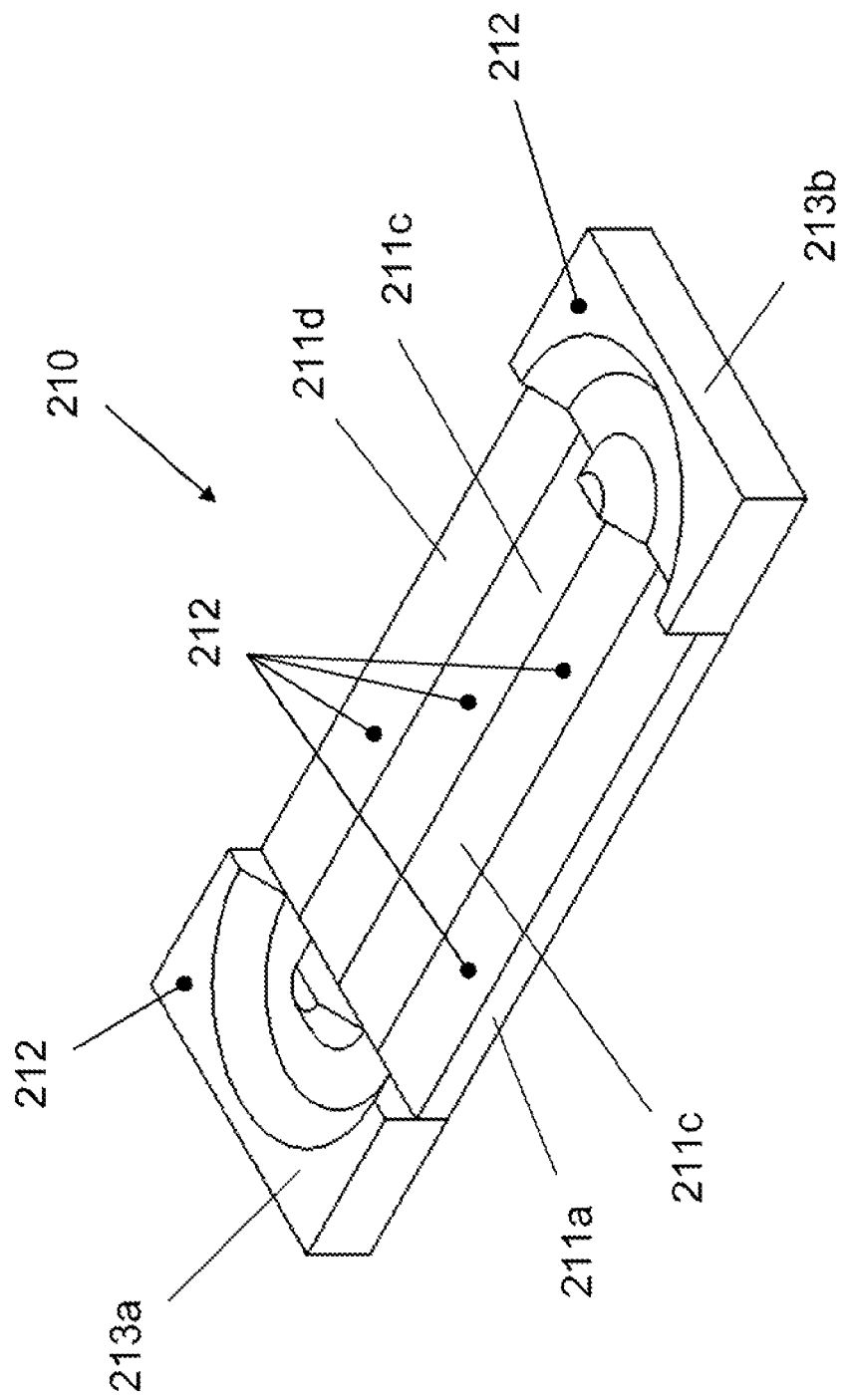
FIG. 2F is an exemplified perspective view of the target assembly after another period of sputtering applied to the target assembly of FIG. 2D.
Figure 2G:
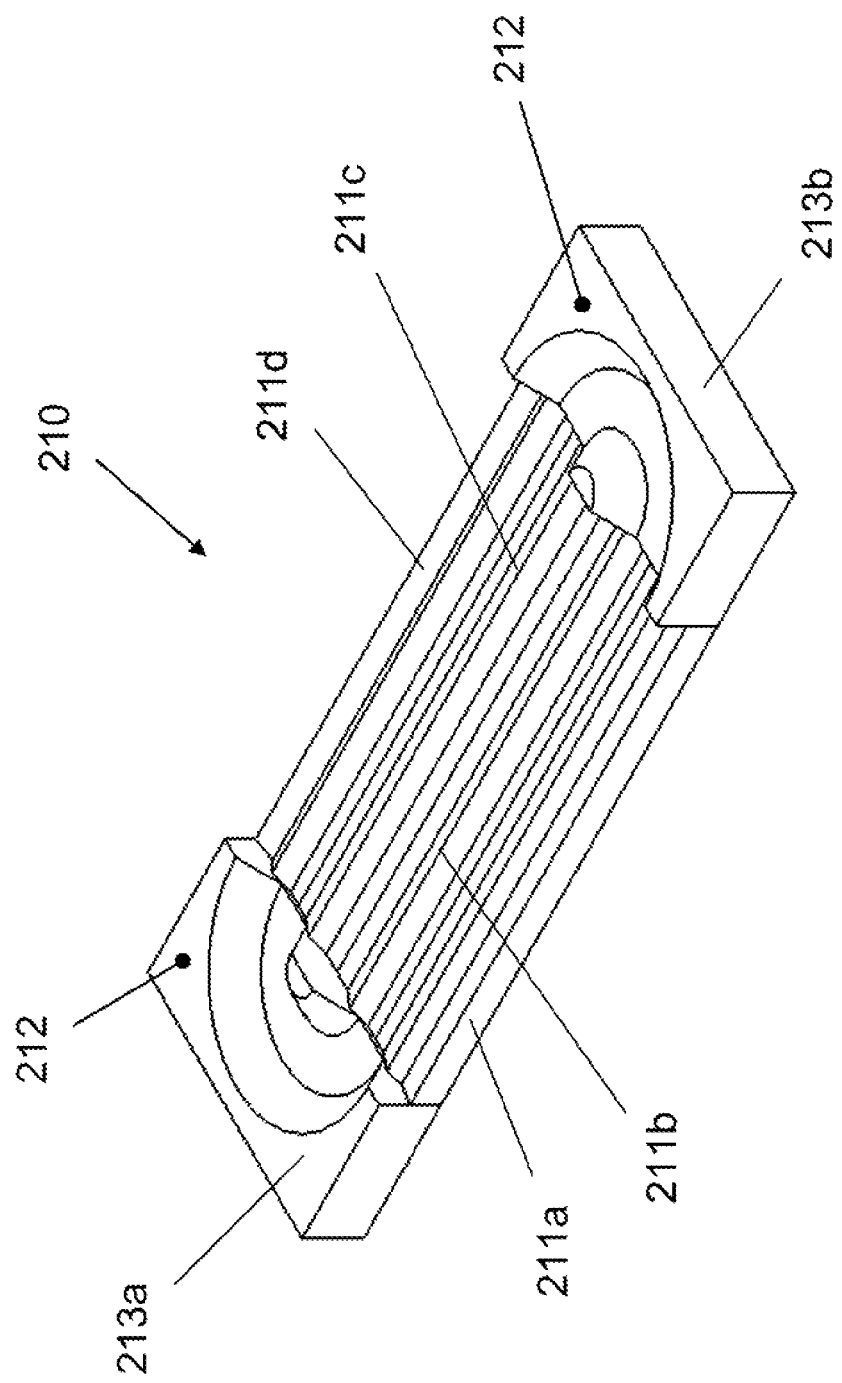
FIG. 2G is another exemplified perspective view of the target assembly after another period of sputtering applied to the target assembly of FIG. 2D.

The end target pieces 212a and 212b can be respectively replaced by new end target pieces 213a and 213b having flat sputtering surfaces. Alternatively, end target pieces 212a and 212b can be selected to be thicker than the linear pieces 211a-211d such that the groove 215c and 215d do not run through the end target pieces 212a and 212b after the linear pieces 211a-211d are used up after the reconfigurations, as shown in FIGS. 2F and 2G.

Figure 1E:
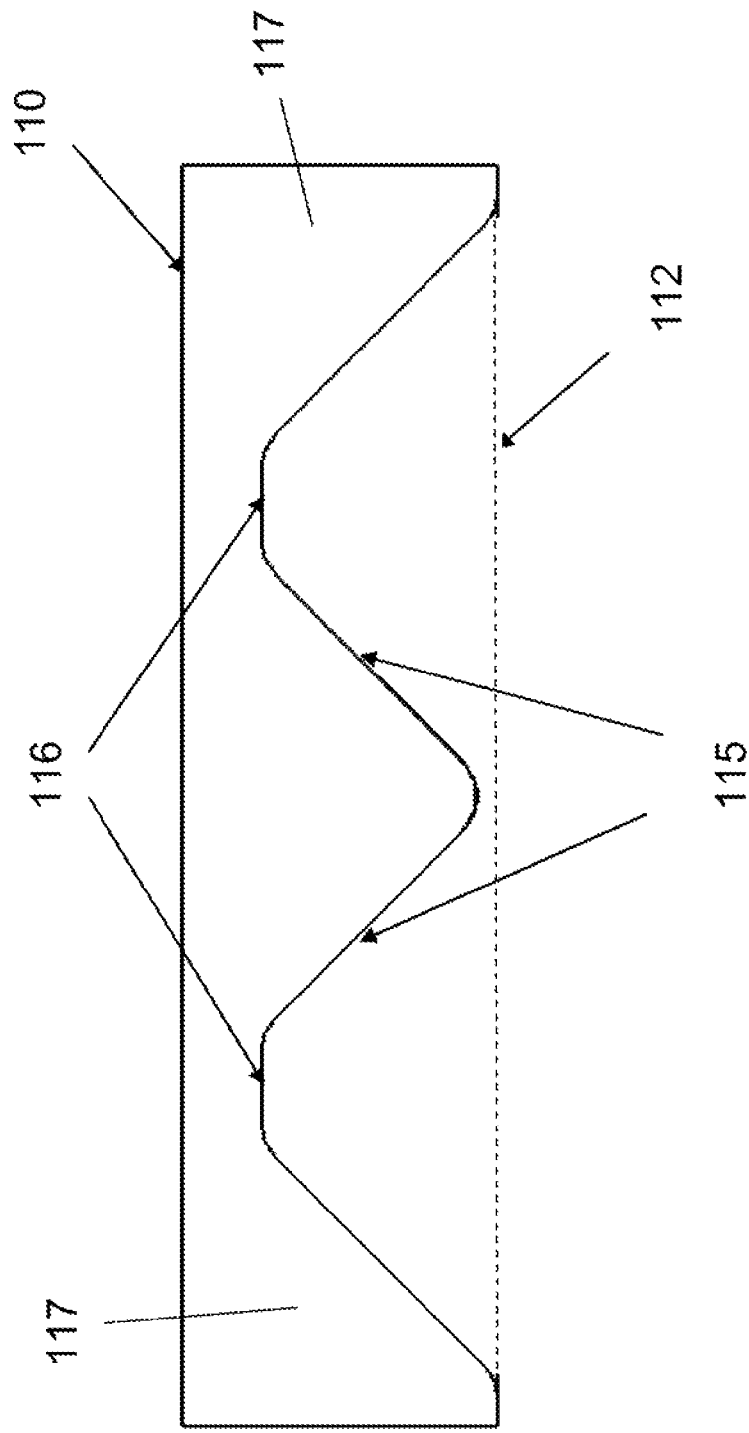
FIG. 1E is a cross-sectional view of the erosion pattern on the target along line A-A FIG. 1D.

The re-configured target assembly 210 can then be used for another period of sputtering operations. The additional erosions can substantially flatten out the sputtering surfaces 212 of the linear pieces 211a-211d, as shown in FIG. 2F, or form finer grooves, as shown in FIG. 2G, on the sputtering surfaces 212 of the linear pieces 211a-211d. When the target assembly 210 becomes very thin in one or more areas under the sputtering surface 212, the whole target assembly 210 can be replaced. The substantially flattened sputtering surfaces 212 on the linear pieces 211a-211d can assure much more even material erosion at the end of the target assembly's lifetime. The amount of unused target materials can therefore be significantly reduced compared to some conventional deposition systems (e.g. large amount of unused target material 117 remains at the end of target life time as shown in FIG. 1E).

Target materials compatible with the target assembly 210 can include copper backing plate, aluminum alloys backing plate, stainless steel backing plate, titanium alloy backing plate, other backing plate, aluminum (Al), aluminum zinc (AlZn), aluminum zinc oxide (AlZnO), aluminum oxide (Al2O3), aluminum nitride (AlN), aluminum copper (AlCu), aluminum silicon (AlSi), aluminum silicon copper (AlCuSi), aluminum fluoride (AlF), antimony (Sb), antimony telluride (SbTe), barium (Ba), barium titanate (BaTiO), barium fluoride (BaF), barium oxide (BaO), barium strontium titanate (BaSrTiO) barium calcium cuprate (BaCaCuO), bismuth (Bi), bismuth oxide (BiO), bismuth selenide (BiSe), bismuth telluride (BiTe), bismuth titanate (BiTiO), boron (B), boron nitride (BN), boron carbide (BC), cadmium (Cd), cadmium chloride (CdCl), cadmium selenide (CdSe), cadmium sulfide (CdS), CdSO, cadmium telluride (CdTe), CdTeHg, CdTeMn, cadmium stannate (CdSnO), carbon (C), cerium (Ce), cerium fluoride (CeF), cerium oxide (CeO), chromium (Cr), chromium oxide (CrO), chromium silicide (CrSi), cobalt (Co), copper (Cu), copper oxide (CuO), copper gallium (CuGa), CuIn, CuInSe, CuInS, CuInGa, CuInGaSe (CIGS), CuInGaS, Dy, Er, ErBaCuO, Eu, Gd, Ge, GeSi, Au, Hf, HfC, HfN, Ho, In, InO, InSnO (ITO), Ir, Fe, FeO, La, LaAlO, LaNiO, LaB, LaO, Pb, PbO, ObTe, PbTiO3, PbZrO, PbZrTiO (PZT), LiNbO, Mg, MgF, MgO, Mn, MnO, Mo, MoC, MoSi, MoO, MoSe, MoS, Nd, NdGaO, Ni, NiCr, NiFe, NiO, NiV, Nb, NbC, NbN, NbO, NeSe, NbSi, NbSn, Pd, NiFeMoMn (permalloy), Pt, Pr, PrCaMnO (PCMO), Re, Rh, Ru, Sm, SmO, Se, Si, SiO, SiN, SiC, SiGe, Ag, Sr, SrO, SrTiO (STO), Ta, TaO, TaN, TaC, TaSe, TaSi, Te, Tb, Tl, Tm, Sn, SnO, SnOF (SnO:F), Ti, TiB, TiC, TiO, TiSi, TiN, TiON, W, WC, WO, WSi, WS, W—Ti, V, VC, VO, Yb, YbO, Y, YbaCuO, YO, Zn, ZnO, ZnAlO (ZAO), ZnAl, ZnSn, ZnSnO, ZnSe, ZnS, ZnTe, Zr, ZrC, ZrN, ZrO, ZrYO (YSZ), and other solid element or compound. The end target pieces 212a and 212b and the linear target pieces 211a-211d can include a substantially same target material or different target materials.

Figure 3A:
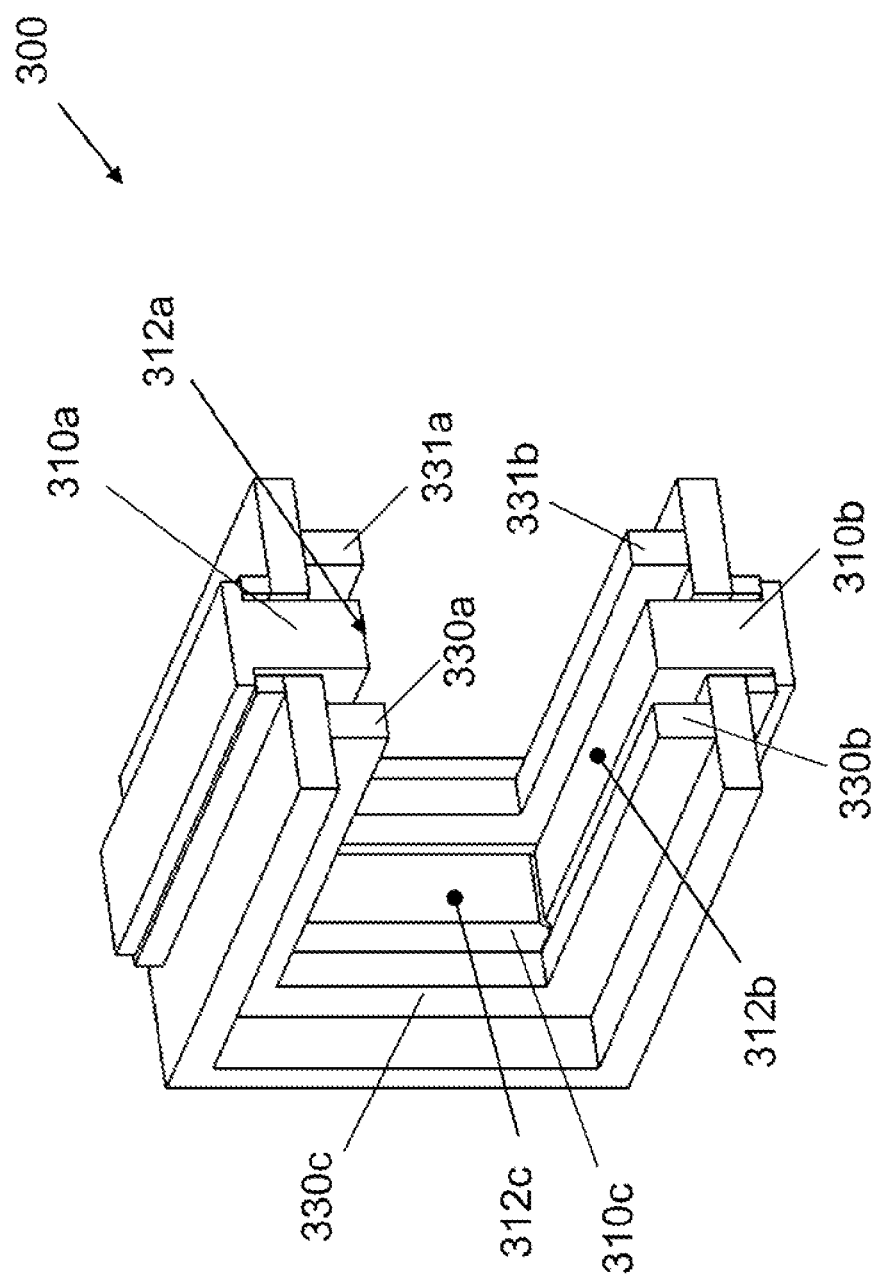
FIG. 3A is a perspective view of a close-loop target/magnetron assembly.
Figure 3B:
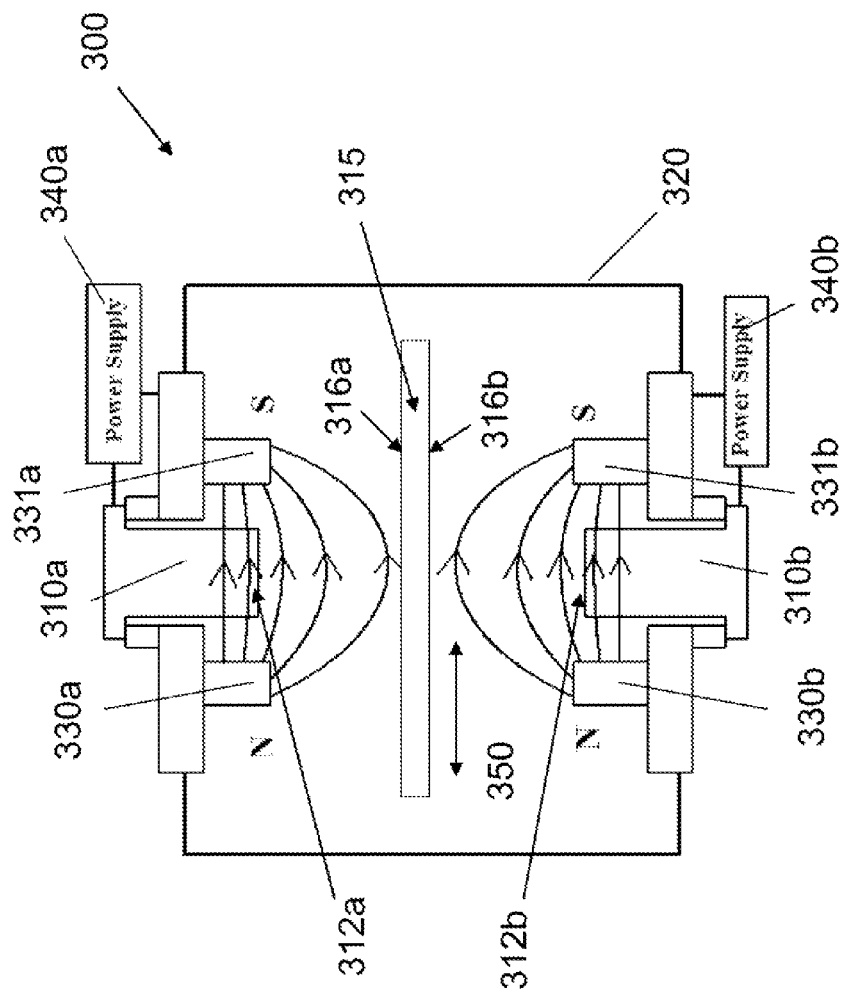
FIG. 3B is a cross-sectional view of a deposition system incorporating the close-loop target/magnetron assembly of FIG. 3A.

The above described target assembly is suitable for various target/magnetron arrangements. For example, a target/magnetron assembly 300 is shown in FIGS. 3A and 3B. A plurality of target assemblies 310a-310c, and 310d (not shown) can form a rectangular close-loop in a chamber 320. Magnets 330a-330c, and 330d (not shown) of a first polarity can form a close loop next to the target assemblies 310a-310d. Magnets 331a-331c, and 331d (not shown) of a second polarity opposite to the first polarity can form another close loop on the other side of the target assemblies 310a-310d. A substrate 315 in the chamber 320 can be positioned in the center of the close loop formed by the target assemblies 310a-310d. The substrate 315 can be transported in a direction 350. The sputtering surfaces 312a-312c, and 312d (not shown) can be oriented facing the substrate 315 to allow deposition on simultaneously on two opposite surfaces 316a, 316b of the substrate 315. The magnetic flux lines can have components substantially parallel to the sputtering surfaces 312a-312d. Ionized electrons can be trapped in a close loop near the sputtering surfaces 312a-312d and between the magnets 330a-330d and magnets 331a-331d. Single or multiple power supplies 340a-340d (340c and 340d are not shown) can respectively provide voltage bias between the target assemblies 310a-310d and the walls of the chamber 320. The biased voltage attracts ions and provides energy for sputtering deposition. The electrons forms a closed loop traveling over the sputtering surfaces 312a-312d, covering the entire length of each target assembly. This can avoid the partially eroded targets at end of the target's usage life shown in FIGS. 2B, 2F and 2G. Alternatively, each target assembly 310a-310d can also be configured as shown in FIGS. 2A-2F and used by processes as described above. The magnets 330a-d and 331a-d can be replaced by magnets each of which has similar shapes to FIG. 1C. The magnets can form a close loop behind the sputter surfaces 312a-312d.

The substrates 315 can include a rigid substrate such as a circular or rectangular semiconductor wafer, a glass or ceramic panel, a metal plate, or a flexible sheet that can be mounted on a drive roller and a feed roller. The substrates 315 can also include several smaller substrates mounted on the solid plates.

Figure 4A:
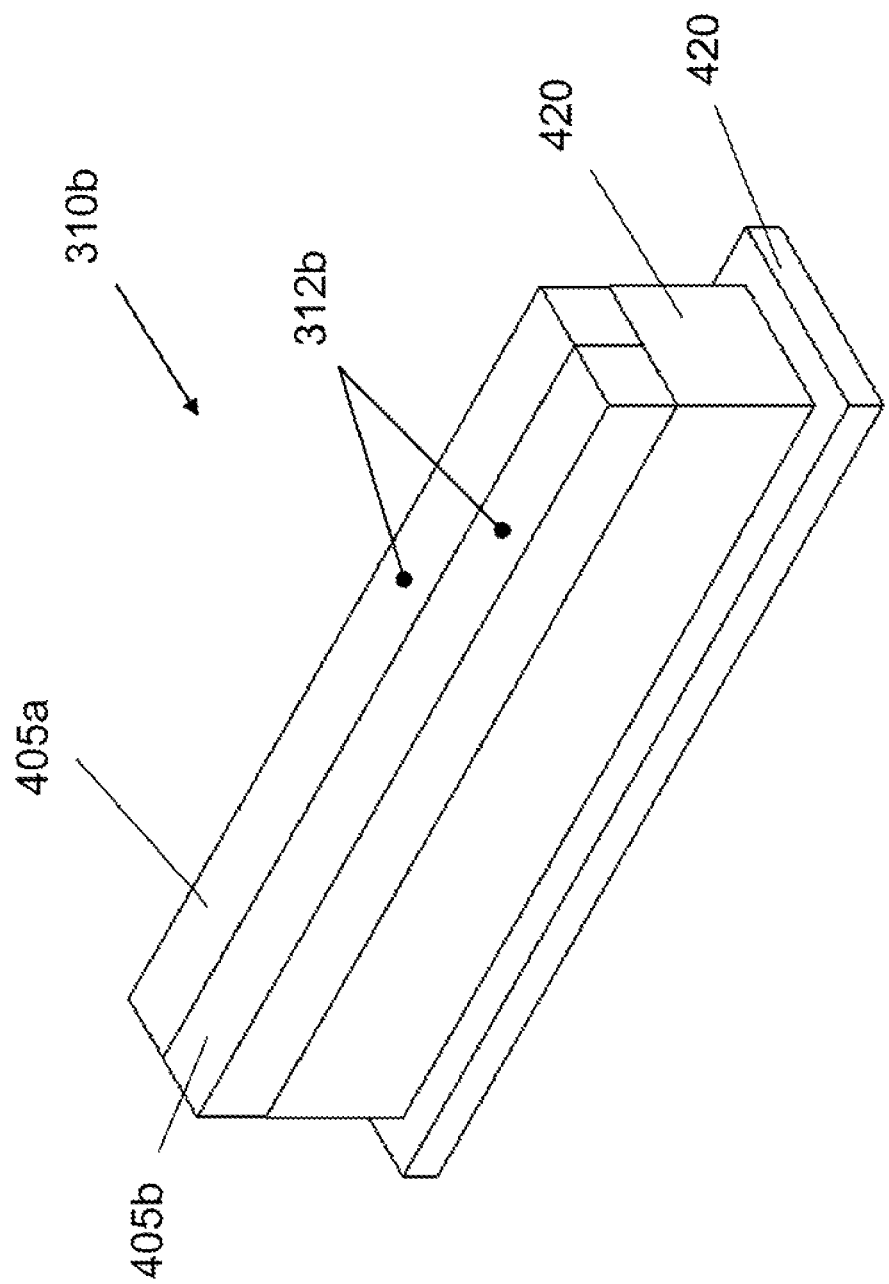
FIG. 4A is a perspective view of a target assembly suitable for the close-loop target/magnetron assembly of FIG. 3A.
Figure 4B:
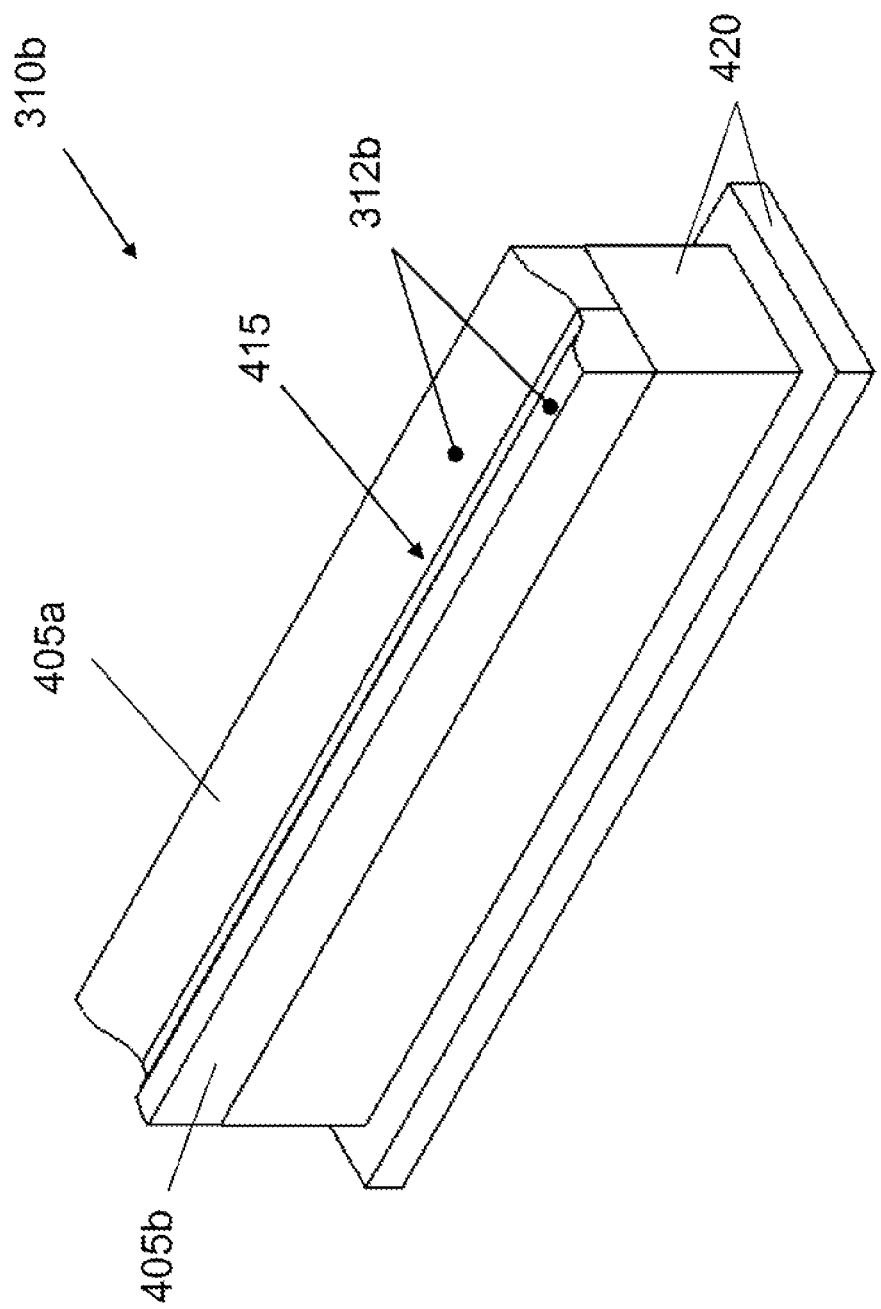
FIG. 4B is a perspective view of the target assembly of FIG. 4A after a period of sputtering operations.
Figure 4C:
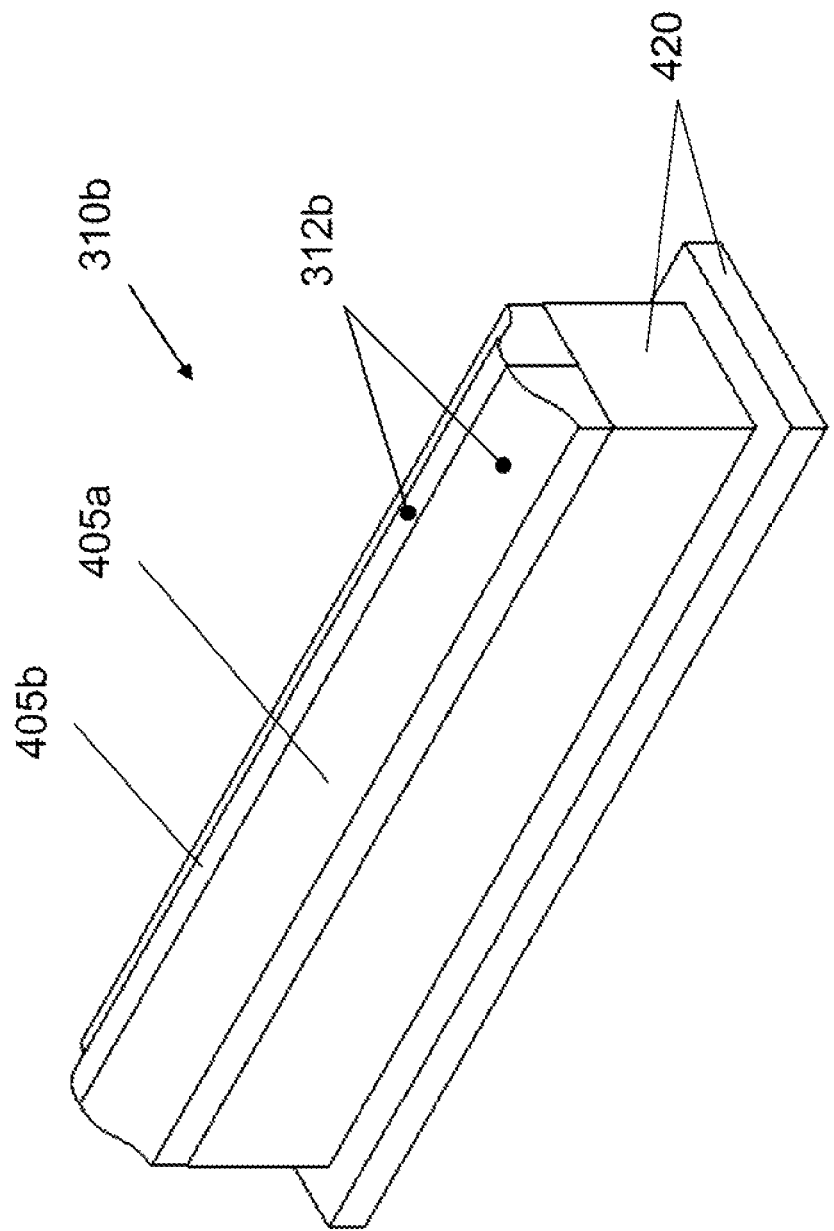
FIG. 4C is a perspective view of a target assembly after reconfiguration and replacement of the target assemble in FIG. 4B.
Figure 4D:
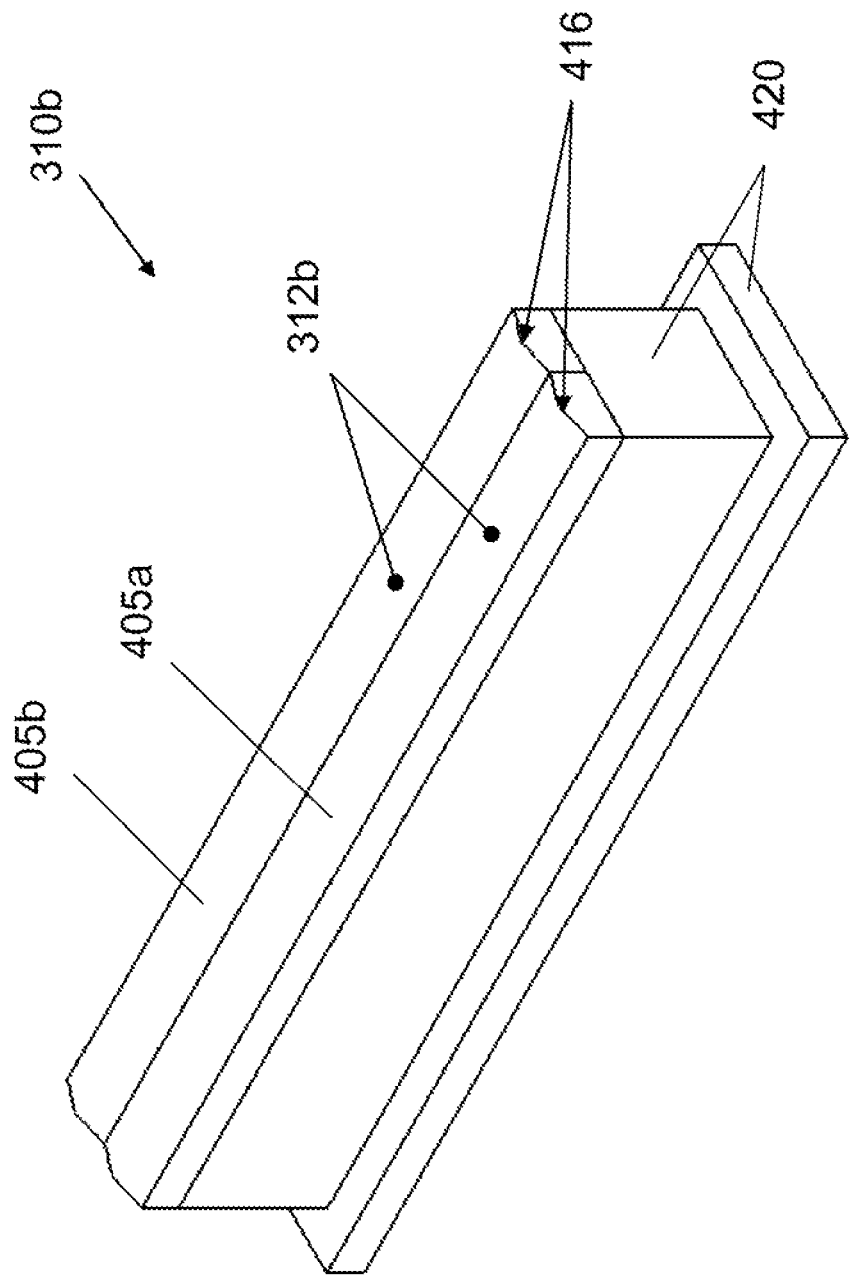
FIG. 4D is a perspective view of a target assembly after another period of sputtering applied to the target assembly of FIG. 4C.

An implementation of a target assembly suitable for target assembly 310b in the close-loop target/magnetron assembly 300 is shown in FIG. 4A. The target assembly 310b can include targets 405a and 405b that are disposed side by side, and a backing plate 420 that can hold the targets 405a and 405b. The targets 405a and 405b can be bonded to the backing plate 420. After an extended period of sputtering operations, an erosion groove 415 appears on the sputtering surfaces 312b, as shown in FIG. 4B. The location of the erosion groove 415 is determined by the magnetic field produced by the magnets 330b and 331b. The erosion groove 415 forms in the center because more electrons are trapped along a close loop that passes the centers of the sputtering surfaces 312a-312d. The targets 405a and 405b are then detached from the backing plate 420, swapped in their positions, and again bonded to the backing plate 420, as shown in FIG. 4C. Alternatively, targets 405a and 405b can also be detached, rotated by an angle such as 180 degrees and remounted in the same respective location of the backing plate 420, as shown in FIG. 4C. The reconfigured targets 405a and 405b produce a ridge along the center of the sputtering surfaces 312b. The reconfigured targets 405a and 405b are used again for a period of sputtering operations. The ridge along the center of the sputtering surfaces 312 is eroded to produce more evenly eroded profiles 416 on the sputtering surfaces 312, as shown in FIG. 4D. The targets 405a and 405b can be reconfigured more than once to further even out the erosion profiles.

It should be noted that due to the close-loop configuration of the target/magnetron assembly 300, the implementation for the target assembly 310b shown in FIGS. 4A-4D does not include end target pieces in the target assembly 210 (shown in FIG. 2A-2F). All the target pieces in the target assembly 310b can therefore be reconfigured to achieve even erosion surface profile. No excess target materials are wasted in the end target pieces. The implementation for the target assembly 310b can thus further improve material utilization compared the target assembly 210. In principle, close to 100% target material utilization can be achieved using the target/magnetron assembly 300 and implementation for the target assembly 310b as shown in FIGS. 4A-4D.

It is understood that although a single erosion groove is shown in a target assembly in FIG. 4B, multiple erosion grooves can be produced after extended period of sputtering. The erosion profile on the target surface can depend on the number of positions of the magnets, the number and positions of the target pieces. For example, the target pieces can be rectangular shaped. Multiple parallel erosion grooves can appear on the sputtering surfaces. Multiple rows of magnets of alternating polarities (South, North, South, etc.) can be placed behind the target assembly to produce plurality of close loops to trap electrons. The erosion grooves can match the locations of the close loops for the electron paths. In various configurations of magnetron/target assemblies, the target pieces in a target assembly can be arranged such that erosion profiles can be evened out after reconfigurations of the target pieces.

Figure 5A:
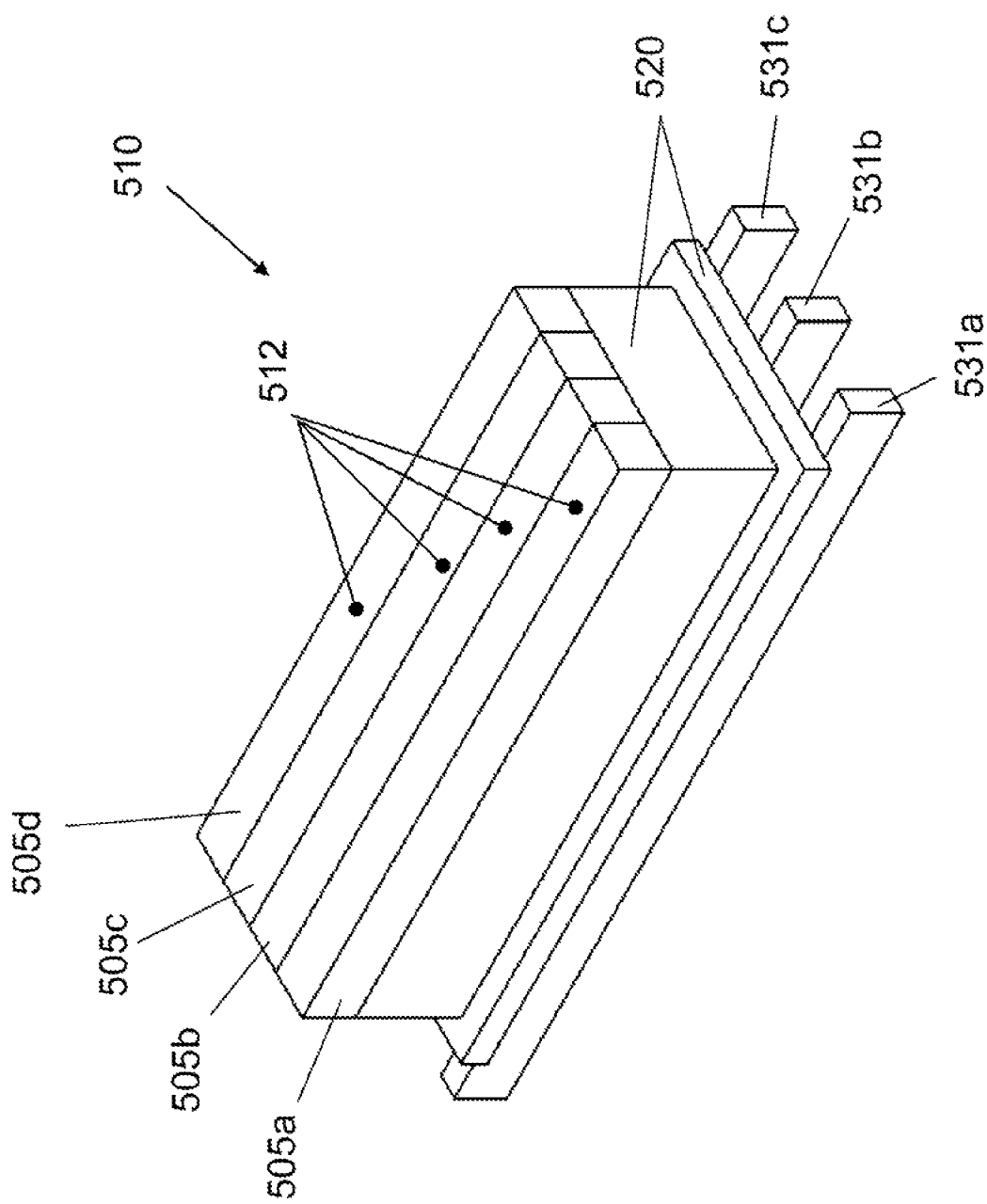
FIG. 5A is a perspective view of another target/magnetron assembly wherein the magnetron is disposed behind a sputtering surface of a target assembly.

In another example, referring to FIG. 5A, a target/magnetron assembly 510 includes a plurality of target pieces 505a-505d juxtaposed relative to each other. The target pieces 505a-505d include sputtering surfaces 512 that are positioned substantially in a same plane (i.e. co-planar). The target pieces 505a-505d are attached and supported by one or more backing plates 520. Multiple rows of magnets 531a-531c are positioned behind the backing plates 520. The magnets 531a-531c can have alternating polarities, for example, a South Pole for the magnet 531a, a North Pole for the magnet 531b, and a South pole for the magnet 531c, etc. The target pieces 505a-505d can each have rectangular sputtering surface of substantially the same shape and dimensions. The magnets 531a-531c can have elongated forms in parallel with the target pieces 505a-505d. The magnets 531a-531c can be symmetrically positioned relative to the target pieces 505a-505d, that is, the magnet 531b can be positioned under the border between the target pieces 505b and 505c. The magnets 531a and 531c can be positioned at an equal distance to the magnet 531b.

Figure 5B:
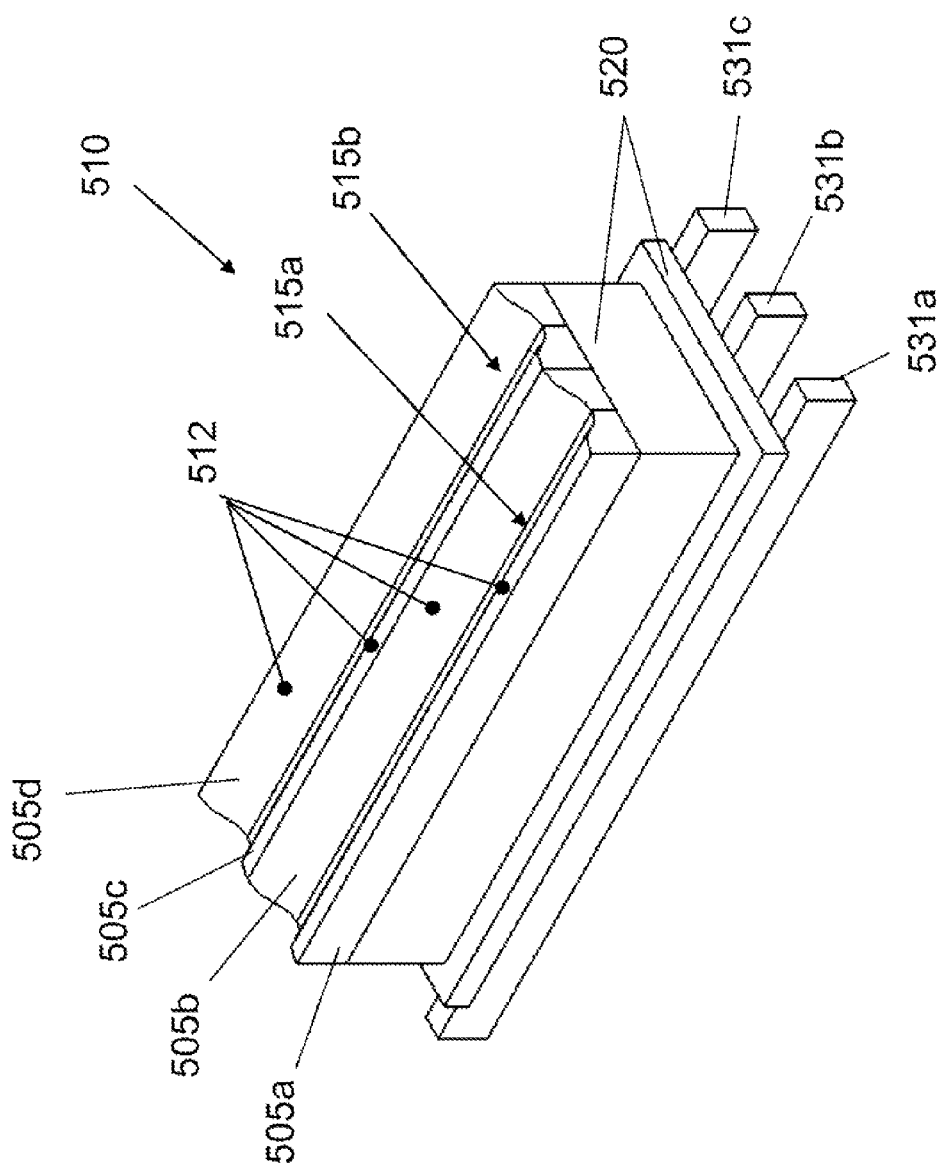
FIG. 5B is a perspective view of target erosion profiles of the target/magnetron assembly of FIG. 5A after the target was sputtered an extended period of time.
Figure 5C:
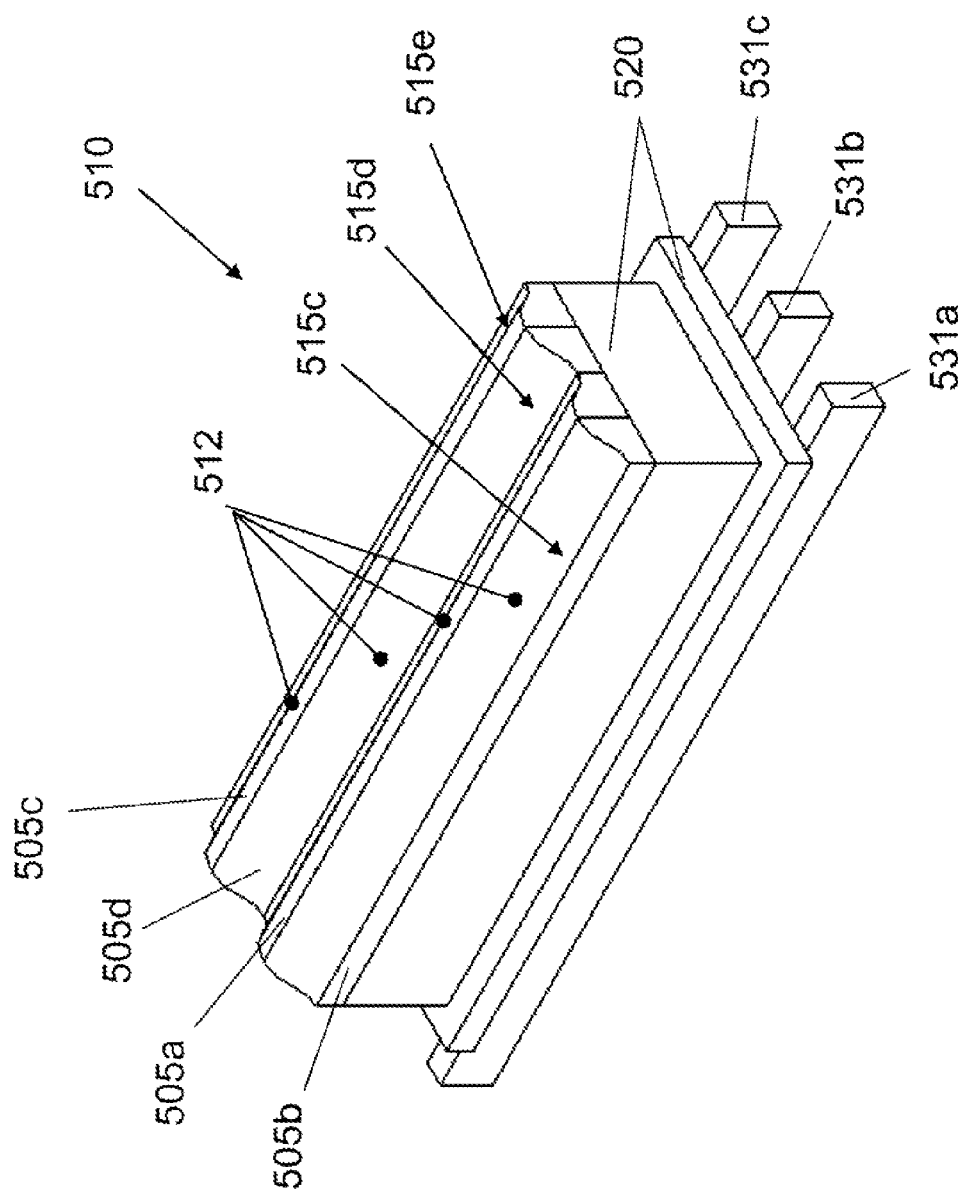
FIG. 5C is a perspective view of the target/magnetron assembly in FIG. 5B after target reconfiguration.

After an extended period of sputtering operations, erosion grooves 515a and 515b, as shown in FIG. 5B, appear on the sputtering surfaces 512 of the target pieces 505a-505d. The target pieces 505a-505d are then detached from the backing plates 520, switched in positions, or rotated by an angle such as 180 degrees, or a combination of positions and orientations, and re-attached to the backing plates 520, to result in reconfigured target pieces 505a-505d, as shown in FIG. 5C. The reconfigured target pieces 505a-505d can include a different set of erosion grooves 515c-515e and ridges between thereof. The ridges are positioned at where the magnetic filed is at its maximum strength. The erosion grooves 515c-515e are located at where low magnetic field strengths and thus less erosion.

Figure 5D:
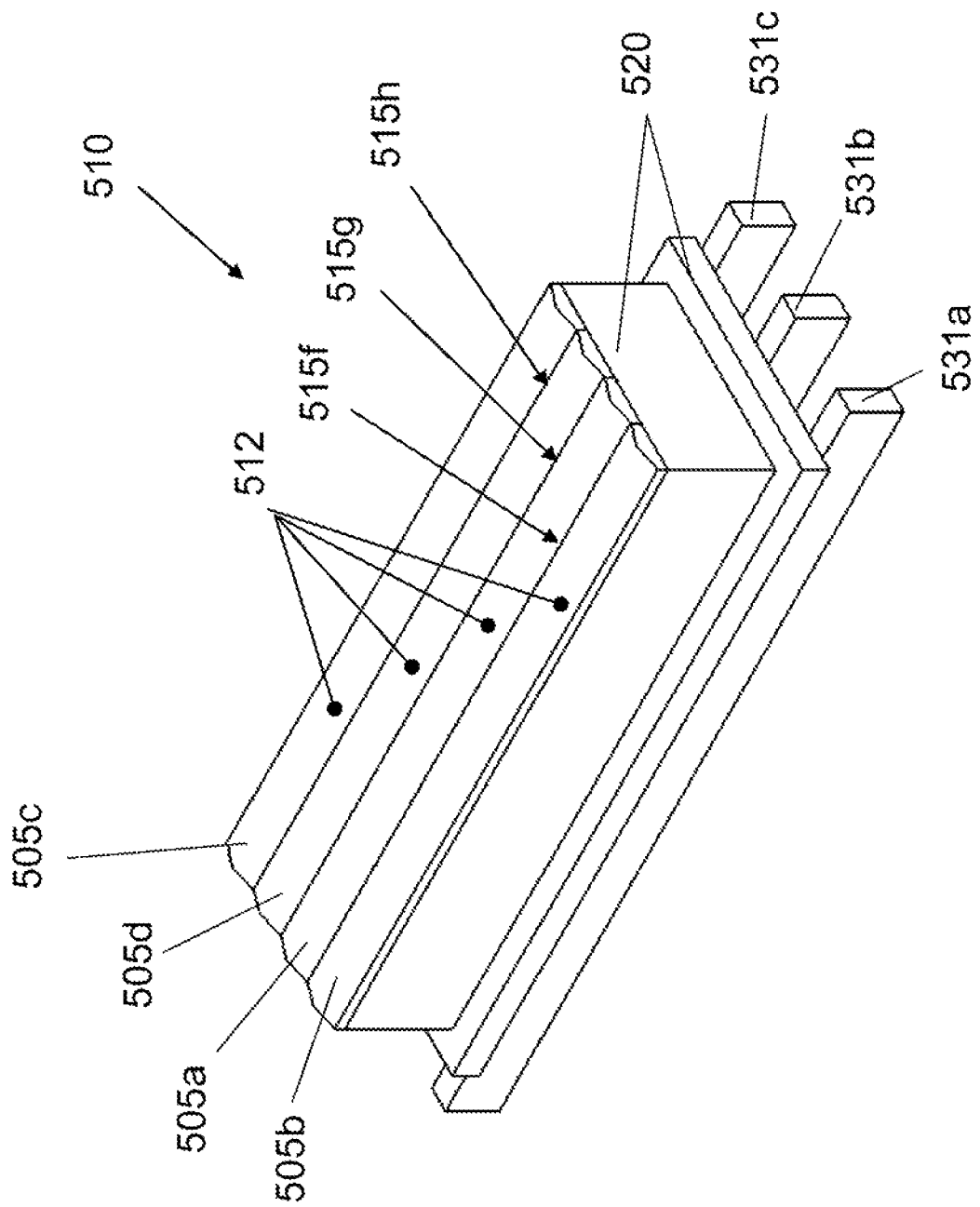
FIG. 5D is a perspective view of target erosion profiles of the target/magnetron assembly after target of FIG. 5C experienced a second extended period of sputtering.

The target/magnetron assembly 510 having reconfigured target pieces 505a-505d is then used for sputtering for another extended period of time, the ridges between erosion grooves 515c-515e shown in FIG. 5C are eroded more than the erosion grooves 515c-515e. The resulting sputtering surfaces 512, as shown in FIG. 5D, have much more evenly distributed erosion surface profile than those as shown in FIG. 5B after the first period of sputtering operations. The erosion grooves 515f-515h on the sputtering surfaces 512 are much shallower than the erosion surfaces 515a-515e. The evenly eroded target materials in the target pieces 505a-505d can result in significant reduction in target material wasted at the end of usage lives for the target pieces 505a-505d.

In some embodiments, a close-loop target/magnetron assembly can have the sputtering surfaces facing outward instead of toward the center of the close loop (shown in FIGS. 3A and 3B). The target assembly and reconfiguration procedures illustrated in FIGS. 4A to 4D and described in the related discussions can be applied to these deposition systems.

Figure 6A:
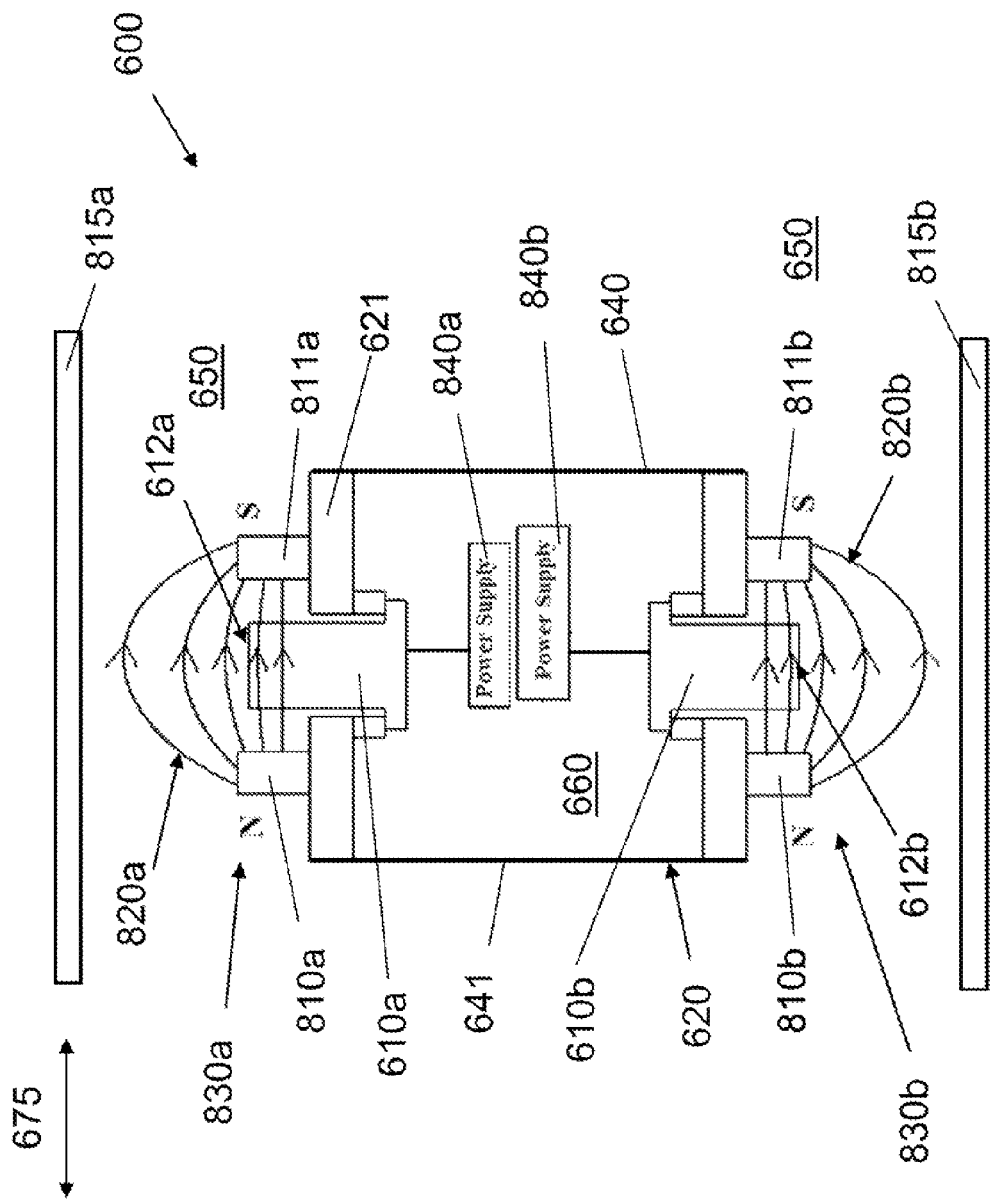
FIG. 6A is a cross-sectional view of a deposition system incorporating an exemplified close-loop target/magnetron assembly having the sputtering surfaces facing outward.

Referring to FIG. 6A, a deposition system 600 can include a plurality of targets 610a, 610b, 611c (not shown), and 611d (not shown) positioned in a close loop outside the space 660. A plurality of magnets 810a, 810b, 810c (not shown), and 810d (not shown) can be positioned to form a close loop around the space 660. A plurality of magnets 811a, 811b, 811c (not shown), and 811d (not shown) of opposite polarity to that of the magnets 810a-810d can also form a close loop around the space 660. The magnets can be positioned in a vacuum environment. The close loops formed by the magnets 810a, 810b, 810c, and 810d, and the magnets 811a, 811b, 811c, and 811d can form a close-loop trap for electrons near the sputtering surfaces 612a-612b, and 612c-612d (not shown).

A magnetron 830a can include a pair of magnets 810a and 811a on the two sides of a target 610a. The magnet 810a can have a "North" ("N") polarity and the magnet 811a can have a "South" ("S") polarity. Similarly, a magnetron 830b can be held on the inner chamber wall 621 opposite to the magnetron 830a across the space 660. The magnetron 830b can include a pair of magnets 810b and 811b on the two sides (above and below) of the target 610b. The magnet 810b can have a "North" polarity and the magnet 811b a "South" polarity. The magnets 810a, 811a, 810b, and 811b can include permanent magnets such as rare earth magnets and ceramic magnet that can be used individually or be connected with ferromagnetic material such as 400 series stainless steel and Mu-metal.

The magnets 810a and 811a can produce magnetic flux lines 820a. Some of the magnetic flux lines 820a are substantially parallel to the sputtering surface 612 that can be exposed in a vacuum environment in the space 650. The magnetic field flux lines 820a have large components parallel to the sputtering surface 612 on the target 610a. Electrons can depart from the sputtering surface 612 (cathode) at a high velocity driven by a negative bias on the target 610a. Lorenz forces generated by the magnetic fields can bend the electron paths back to the sputtering surface 612a and 612b. The increased electron density near the sputtering surface 612 can enhance the plasma ionization efficiency. A substrate 815a positioned to receive materials sputtered off the target 610a. The substrate 815a can be transported in the direction 675 to allow uniform deposition on the surface of substrate 815a.

The magnets 810a, 810b and magnets of the "North" polarity on the other inner chamber walls 641 can form a close loop. The magnets 811a, 811b and magnets of the "South" polarity on the other inner chamber walls 621 can form another close loop. The magnetic flux lines between the two close-loop magnets can form a close-loop electron path that can effectively confine the movement of free electrons near the sputtering surfaces 612 of the targets around the space 650. The electrons can be confined near the maximum magnetic field that is parallel to the sputtering surfaces 612. The electrons can hop along the path in the close loop. Since the magnets 810a, 810b, 811a and 811b are placed on the two sides the target 610a or 610b (instead of behind the sputtering surface 612 of the target 610a or 610b), the target 610a or 610b can be thick or made of magnetic materials and still have strong magnetic flux over the sputtering surface 612. Furthermore, the magnetic flux line 820a and 820b are more uniform compared to conventional sputtering source where the magnets are behind the target, it result in more uniform sputtering rate across the sputtering surface 612, more uniform erosion pattern and improves the target utilization.

Figure 6B:
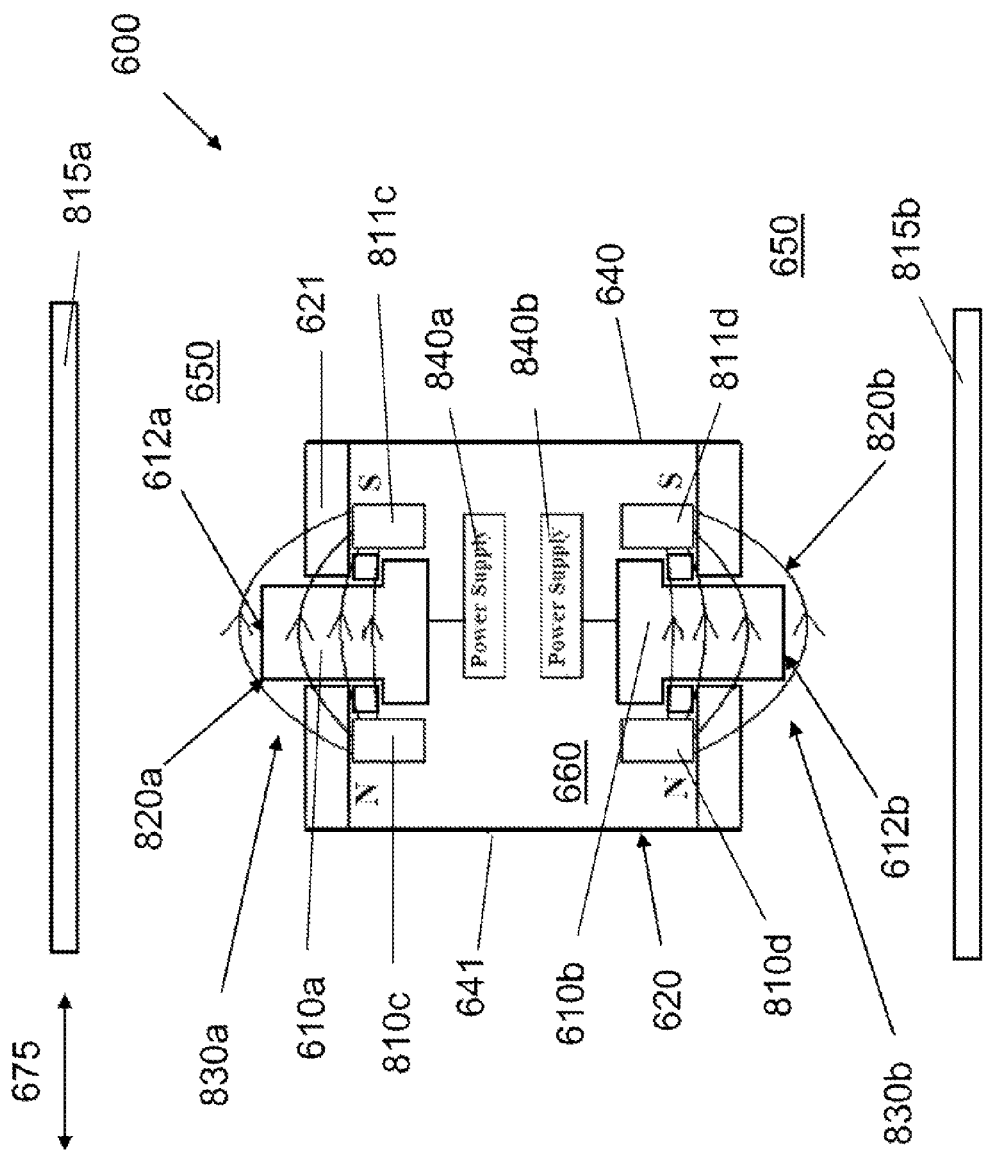
FIG. 6B is a cross-sectional view of a deposition system incorporating another exemplified close-loop target/magnetron assembly having the sputtering surfaces facing outward.

In some embodiments, referring to FIG. 6B, the magnetron 830a and 830b can also include a pair of permanent magnets 810a and 811a or 810b and 811b on the two sides of the target 610a or 610b. For example, the magnet 810a can have a "North" polarity and the magnet 811a a "South" polarity. The magnets 810a and 811a can produce magnetic flux lines 820a. Some of the magnetic flux lines 820a can be substantially parallel to the sputtering surface 612 that can be exposed in a vacuum environment in the space 650. The magnets 810a and 811a and the magnets 810b and 811b can be outside of the vacuum environment. A substrate 815a is positioned to receive materials sputtered off the sputtering surface 612a on the target 610a.

It is understood that the disclosed system and methods are not limited to the specific examples described above. For example, the target assembly can include one target piece before the first sputtering operation. The target assembly can then be divided into multiple pieces after the first extended sputtering period. The erosion pattern can include other profiles such as non-linear smooth varying surfaces. The closed loop target assemblies can be made of different sizes, configured in the number of 3, 5, 6, 7, 8, and more pieces in a system, or using electro magnets. The different pieces of target can also be made of different materials. Co-sputtering of two different target materials can be achieved with high target utilization. The deposition system can have different shapes. For example, the cross-section of the deposition chamber can be round, hexagonal, rectangular, and so on. The disclosed deposition system is suitable for material depositions on large or small substrates. The substrate can be heated and/or applied with an electric bias voltage. The processing system can also include a vacuum load-lock and a cleaning chamber for cleaning the substrate. The substrate transport mechanism can also take various forms without deviating from the spirit of the specification. The sources can also be transported relative to the substrates. Furthermore, the chamber can include holders for the substrates and the targets. The disclosed substrates and targets in the chamber are compatible with different holder mechanisms.

What is claimed is:

1. A deposition system, comprising:
    a plurality of substrates;
    a plurality of target assemblies are sequentially positioned in a first close loop that defines a plane, wherein at least one of the target assemblies comprises:
        a first target piece including a first sputtering surface and a first target material configured to be sputtered off the first sputtering surface and to deposit on one of the substrates; and
        a second target piece juxtaposed to the first target piece, wherein the second target piece includes a second sputtering surface and a second target material configured to be sputtered off the second sputtering surface and to deposit on the one of the substrates, wherein the first target piece and the second target piece are configured to be switched in positions, or orientation, or a combination thereof after a period of sputtering operations; and
    a transport mechanism configured to produce relative movements between the plurality of substrate and the plurality of target assemblies in a direction perpendicular to the plane defined by the close loop to allow at least one of the plurality of substrates to receive materials sputtered off the first sputtering surface and the second sputtering surface.

2. The magnetron/target assembly of claim 1, wherein the at least one of the target assemblies further comprises:
    a backing plate bonded to the first target piece and the second target piece; and
    a power supply configured to apply a common voltage to the first target piece and the second target piece during deposition.

3. The target assembly of claim 1, wherein the first sputtering surface and the second sputtering surface are substantially co-planar.

4. The deposition system of claim 1, wherein the first sputtering surface and the second sputtering surface are positioned outward relative to the first close loop.

5. The deposition system of claim 1, wherein the first sputtering surface and the second sputtering surface are positioned inward relative to the first close loop.

6. The deposition system of claim 1, further comprising a chamber configured to produce a vacuum environment for the first sputtering surface, the second sputtering surface, and a surface for each of the plurality of substrates.

7. The deposition system of claim 1, wherein the transport mechanism is configured to move the plurality of substrate perpendicular to the plane defined by the close loop to allow at least one of the plurality of substrates to receive materials sputtered off the first sputtering surface and the second sputtering surface.

8. The deposition system of claim 1, wherein the plurality of substrates are distributed in a second close loop, wherein each of the substrates includes a surface configured to receive a target material sputtered off from one of the target assemblies.

9. The deposition system of claim 1, further comprising a magnetron configured to produce a magnetic field near the first sputtering surface and the second sputtering surface to deposit the first target material and the second target material to the one of the substrates.

10. The deposition system of claim 9, wherein the magnetron comprises a first magnet of a first polarity and a second magnet of a second polarity opposite to the first polarity.

11. The deposition system of claim 10, wherein the first magnet and the second magnet are positioned on the sides of the first target piece and the second target piece opposite to the first sputtering surface and the second sputtering surface.

12. The deposition system of claim 10, wherein the first magnet and the second magnet are so positioned that at least a portion of the magnetic field between the first magnet and the second magnet is substantially parallel to the first sputtering surface and the second sputtering surface.

13. The deposition system of claim 1, wherein the first target piece and the second target piece comprise substantially a same target material.

14. The deposition system of claim 1, wherein the first target piece and the second target piece comprise different target materials.

15. The deposition system of claim 1, wherein the first target piece and the second target piece have substantially the same shape and dimensions.

16. The deposition system of claim 1, wherein the first target piece and the second target piece are rectangles with a long side of the first target piece positioned by a long side of the second target piece.

17. A deposition system, comprising:
a transport mechanism configured to move a plurality of substrates in a first direction; and
a plurality of target assemblies are sequentially positioned in a first close loop defining a plane perpendicular to the first direction, wherein at least one of the target assemblies comprises:
a first target piece including a first sputtering surface and a first target material configured to be sputtered off the first sputtering surface and to deposit on one of the substrates; and
a second target piece juxtaposed to the first target piece, wherein the second target piece includes a second sputtering surface and a second target material configured to be sputtered off the second sputtering surface and to deposit on the one of the substrates, wherein the first target piece and the second target piece are configured to be switched in positions, or orientation, or a combination thereof after a period of sputtering operations, wherein the first sputtering surface and the second sputtering surface are oriented outward relative to the first close loop.

18. The deposition system of claim 17, wherein the first sputtering surface and the second sputtering surface are substantially co-planar.

19. The deposition system of claim 17, wherein the plurality of substrates are distributed in a second close loop, wherein the plurality of substrates include surfaces facing inward relative to the first close loop, wherein at least one of the plurality of substrate is configured to receive target material sputtered off from the first sputtering surface and the second sputtering surface.

20. The deposition system of claim 17, further comprising a magnetron configured to produce a magnetic field near the first sputtering surface and the second sputtering surface to deposit the first target material and the second target material to the one of the substrates.

21. The deposition system of claim 17, wherein the magnetron comprises a first magnet of a first polarity and a second magnet of a second polarity opposite to the first polarity, wherein the first magnet and the second magnet are positioned on the sides of the first target piece and the second target piece opposite to the first sputtering surface and the second sputtering surface.

22. The deposition system of claim 17, wherein at least one of the target assemblies further comprises:
a backing plate bonded to the first target piece and the second target piece; and
a power supply configured to apply a common voltage to the first target piece and the second target piece during deposition.

23. The deposition system of claim 17, wherein the first target piece and the second target piece comprise substantially a same target material.

24. The deposition system of claim 17, wherein the first target piece and the second target piece comprise different target materials.

25. The deposition system of claim 17, wherein the first target piece and the second target piece have substantially the same shape and dimensions.

26. A deposition system, comprising:
a transport mechanism configured to move one or more substrates in a first direction; and
a plurality of target assemblies are sequentially positioned in a first close loop defining a plane perpendicular to the first direction, wherein at least one of the target assemblies comprises:
a first target piece including a first sputtering surface and a first target material configured to be sputtered off the first sputtering surface and to deposit on one of the substrates; and
a second target piece juxtaposed to the first target piece, wherein the second target piece includes a second sputtering surface and a second target material configured to be sputtered off the second sputtering surface and to deposit on the one of the substrates, wherein the first target piece and the second target piece are configured to be switched in positions, or orientation, or a combination thereof after a period of sputtering operations, wherein the first sputtering surface and the second sputtering surface are oriented inward relative to the first close loop.

27. The deposition system of claim 26, wherein the first sputtering surface and the second sputtering surface are substantially co-planar.

28. The deposition system of claim 26, wherein the one or more substrates are distributed in a second close loop, wherein the substrates include surfaces facing outward relative to the first close loop, wherein at least one of the plurality of substrate is configured to receive target material sputtered off from the first sputtering surface and the second sputtering surface.

29. The deposition system of claim 26, wherein the one or more substrates comprises a substrate comprising a plurality of substrate surfaces each facing outward relative to the first close loop, wherein at least one of the substrate surfaces is configured to receive target material sputtered off from the first sputtering surface and the second sputtering surface.

30. The deposition system of claim 26, further comprising a magnetron configured to produce a magnetic field near the first sputtering surface and the second sputtering surface to deposit the first target material and the second target material to the one of the substrates.

31. The deposition system of claim 26, wherein at least one of the target assemblies further comprises:
a backing plate bonded to the first target piece and the second target piece; and
a power supply configured to apply a common voltage to the first target piece and the second target piece during deposition.

32. The deposition system of claim 26, wherein the first target piece and the second target piece comprise substantially a same target material.

33. The deposition system of claim 26, wherein the first target piece and the second target piece comprise different target materials.

* * * * *